US012761245B2

(12) United States Patent
Lin et al.

(10) Patent No.: US 12,761,245 B2
(45) Date of Patent: Oct. 13, 2026

(54) VERTICAL PROBE, PROBE HEAD AND METHOD OF MAKING THE VERTICAL PROBE

(71) Applicant: MPI CORPORATION, Chu-Pei City (TW)

(72) Inventors: Chin-Yi Lin, Chu-Pei City (TW); Hsien-Ta Hsu, Chu-Pei City (TW); Che-Wei Lin, Chu-Pei City (TW); Chih-Ming Huang, Chu-Pei City (TW)

(73) Assignee: MPI CORPORATION, Chu-Pei City (TW)

( * ) Notice: Subject to any disclaimer, the term of this patent is extended or adjusted under 35 U.S.C. 154(b) by 149 days.

(21) Appl. No.: 18/928,912

(22) Filed: Oct. 28, 2024

(65) Prior Publication Data

US 2025/0138050 A1 May 1, 2025

Related U.S. Application Data

(60) Provisional application No. 63/593,614, filed on Oct. 27, 2023.

(51) Int. Cl.
*G01R 1/067* (2006.01)
*G01R 3/00* (2006.01)

(52) U.S. Cl.
CPC ........... *G01R 1/06738* (2013.01); *G01R 3/00* (2013.01)

(58) Field of Classification Search
CPC .. G01R 1/06738; G01R 3/00; G01R 1/07357; G01R 1/06711
See application file for complete search history.

(56) References Cited

U.S. PATENT DOCUMENTS

| | | | | |
|---|---|---|---|---|
| 4,965,865 A | 10/1990 | Trenary | | |
| 11,802,891 B1 * | 10/2023 | Wu | G01R 3/00 | |
| 2012/0286816 A1 * | 11/2012 | Kister | G01R 1/07357 219/121.72 | |

(Continued)

FOREIGN PATENT DOCUMENTS

| | | | |
|---|---|---|---|
| CN | 115598392 A | 1/2023 | |
| JP | 2001-74779 A | 3/2001 | |

(Continued)

*Primary Examiner* — Alvaro E Fortich

(74) *Attorney, Agent, or Firm* — Birch, Stewart, Kolasch & Birch, LLP

(57) ABSTRACT

A vertical probe includes opposite first and third sides, and opposite second and fourth sides. The third and fourth sides extend in a planar manner from a body to a tip portion. The first and second sides include first and second upper plane segments at the body, first and second transition segments at the tip portion, and first and second lower plane segments closer to the third and fourth sides than the first and second upper plane segments are, respectively. The first and second transition segments gradually approach the third and fourth sides as they extend from the first and second upper plane segments to the first and second lower plane segments. The first transition and lower plane segments are realized by laser processing. The vertical probe can contact small conductive contacts with good current resistance, structural strength, lifespan, and processing accuracy. When applied to a probe head, breaking or shifting position of the tip portion due to vertical movement can be avoided.

20 Claims, 15 Drawing Sheets

(56) References Cited

U.S. PATENT DOCUMENTS

| | | | | |
|---|---|---|---|---|
| 2018/0267083 | A1* | 9/2018 | Wei .................... | G01R 1/06727 |
| 2021/0003609 | A1* | 1/2021 | Huang ............... | G01R 1/07314 |
| 2023/0324438 | A1 | 10/2023 | Crippa et al. | |
| 2024/0426871 | A1* | 12/2024 | Ahn ................... | G01R 1/06716 |

FOREIGN PATENT DOCUMENTS

| | | | |
|---|---|---|---|
| JP | 2015-230314 | A | 12/2015 |
| JP | WO2020/017159 | A1 | 1/2020 |
| JP | 2020-507769 | A | 3/2020 |
| TW | I438439 | B | 5/2014 |
| TW | I690709 | B | 4/2020 |

* cited by examiner

VERTICAL PROBE, PROBE HEAD AND METHOD OF MAKING THE VERTICAL PROBE

FIELD OF THE INVENTION

The present invention relates generally to a probe head of a probe card and probes thereof and more particularly, to a vertical probe, a probe head having the vertical probe, and a method of making the vertical probe.

DESCRIPTION OF THE RELATED ART

A conventional vertical probe has an elongated cylindrical shape with a square or rectangular cross-section. This type of vertical probe is typically manufactured through micro-electromechanical systems processes or by cutting plate materials to form desired probe width and probe thickness according to usage requirements. As electronic components continue to miniaturize, the width and thickness of this type of vertical probe also need to be reduced accordingly to enable probing of the small conductive contacts on the device under test, including but not limited to devices with micro bumps.

However, reducing the width and thickness of the entire probe significantly increases its resistance and greatly reduces its structural strength. Higher probe resistance results in lower current-withstanding capacity. If the current-withstanding capacity of the probe is too low, it will be prone to burn out during supplying current. Furthermore, low structural strength makes the probe susceptible to wear, bending, or even breaking under stress during testing, leading to a shorter lifespan and the need for frequent replacement. Thus, achieving sufficient current-withstanding capacity while allowing the probe to probe small conductive contacts and increasing probe lifespan is a significant technical challenge in this field.

SUMMARY OF THE INVENTION

The present invention proposes a vertical probe in which only the width and thickness of the tip portion are reduced, enabling the tip to meet the requirements for probing small conductive contacts, while other sections of the vertical probe have relatively larger width and thickness to provide the probe with good current-withstanding capacity and structural strength. Such vertical probe includes a body and a tip portion having a tip contact section with a width and a thickness smaller than that of the body, and a tip tapering section between the body and the tip contact section. The width reduction of the tip portion can be achieved by micro-electromechanical systems processing or processing a plate material by laser cutting, while the thickness reduction of the tip portion can be realized through mechanical processing or etching of micro-electromechanical systems processing.

However, during the installation of the vertical probe into a probe seat, the probe is first inserted through the upper and lower guide holes of the upper and lower die units of the probe seat. Then, the upper and lower die units are horizontally shifted relative to each other and fixed to form the probe seat. At this time, due to the horizontal offset of the upper and lower guide holes, the body of the vertical probe elastically bends and deforms. For example, if the lower die unit shifts to the left relative to the upper die unit, the body of the vertical probe will bend to the left from top to bottom. In this situation, the right side of the vertical probe will press against the inner surface of the lower guide hole with a contact spot at the body, which is close to the tip tapering section of the tip portion. When the tip contact section of the tip portion contacts the device under test and receives an upward reaction force, the need tip portion will slightly retract elastically into the lower guide hole. Therefore, if the right side of the vertical probe has a discontinuity in plane alignment between the tip tapering section of the tip portion and the body, the structure around this area will have weaker structural strength, and incomplete flat contact with the inner surface of the lower guide hole will happen during up and down movement of the tip portion. That is, the portion of the right side, which contacts the inner surface of the lower guide hole during up and down movement of the right side, has a gap. This will easily result in probe fracture and misalignment of the tip contact section of the tip portion with the conductive contact on the device under test. Furthermore, reducing the thickness of the tip portion through mechanical processing or etching micro-electromechanical systems processing often results in non-compliant tolerances, leading to lower production yield for the probe card.

In view of the above-mentioned circumstances, a primary objective of the present invention is to provide a vertical probe, a probe head, and a method of making the vertical probe, which ensure that the vertical probe meets the requirements for probing small conductive contacts while also offering excellent current-withstanding capacity, structural strength, and durability, and high processing accuracy can be achieves, and, when the vertical probe is applied to a probe head, the tip portion is less likely to fracture due to up and down movement during probing the device under test, and the position of the tip portion is less likely to offset, thereby maintaining alignment with the conductive contacts on the device under test.

To attain the above objective, the vertical probe provided by the present invention comprises an elongated body extending along a longitudinal axis, and a tip portion connected with and extending from the body along the longitudinal axis. The vertical probe includes a first side, a second side, a third side opposite to the first side, and a fourth side opposite to the second side. The third and fourth sides extend in a planar manner from the body to the tip portion. The first side includes a first upper plane segment located at the body, and a first transition segment and a first lower plane segment both located at the tip portion in a way that the first transition segment is located between the first upper and lower plane segments, a first upper boundary line is formed between the first upper plane segment and the first transition segment, a first lower boundary line is formed between the first transition segment and the first lower plane segment, the first lower plane segment is closer to the third side than the first upper plane segment is, and the first transition segment extends from the first upper boundary line to the first lower boundary line in a way that that the first transition segment gradually approaches the third side. The second side includes a second upper plane segment located at the body, and a second transition segment and a second lower plane segment both located at the tip portion in a way that the second transition segment is located between the second upper and lower plane segments, a second upper boundary line is formed between the second upper plane segment and the second transition segment, a second lower boundary line is formed between the second transition segment and the second lower plane segment, the second lower plane segment is closer to the fourth side than the second upper plane segment is, and the second transition segment extends from the second upper boundary line to the lower boundary line in a way that the second transition segment gradually approaches the fourth side. The first transition segment and the first lower plane segment of the first side are formed by a laser processing.

As a result, the vertical probe of the present invention has a non-coplanar design between the tip portion and the body only on the first and second sides. In other words, the first side is designed with the first transition segment and the first lower plane segment to achieve thickness reduction at the tip portion, while the third side, which is opposite to the first side, is coplanar between the body and tip portion. Similarly, the second side is designed with the second transition segment and the second lower plane segment to achieve width reduction at the tip portion, while the fourth side, which is opposite to the second side, is coplanar between the body and tip portion. As a result, the part of the tip portion including the first and second transition segments serves as a tip tapering section, and the part of the tip portion including the first and second lower plane segments serves as a tip contact section. The tip tapering section of the tip portion may gradually reduce to the required thickness and width, allowing the tip contact section of the tip portion to meet the requirements for probing small conductive contacts, while the body retains a relatively larger width and thickness, providing the vertical probe with excellent current-withstanding capacity, structural strength, and durability. Moreover, when the vertical probe is installed in the upper and lower guide holes of the upper and lower die units of the probe seat, and the upper and lower die units shift horizontally relative to each other to cause elastically bending and deformation of the body of the vertical probe, the vertical probe can be abutted against the inner surface of the lower guide hole with the third side and/or the fourth side having a planar shape. Because there is no discontinuity at the part between the body and tip portion on the third and fourth sides, this part may have relatively higher structural strength, ensuring that even if the tip portion moves up and down when probing the device under test and retracts into the lower guide hole, the tip portion will not easily fracture. This design also avoids the position of the tip portion from offset to cause misalignment with the conductive contact of the device under test. Additionally, the first side of the vertical probe undergoes laser processing to form the first transition segment and the first lower plane segment, ensuring high dimensional accuracy of the tip portion. The second transition segment and the second lower plane segment of the second side can also be formed by laser processing, further enhancing the accuracy of the tip portion and thus meeting tolerance requirements of the vertical probe, thereby improving the manufacturing yield of the probe card.

Preferably, the tip portion has a contact end furthest from the body. The distance between the first lower boundary line and the contact end along the longitudinal axis is defined as a first height, while the distance between the second lower boundary line and the contact end along the longitudinal axis is defined as a second height. The first and second heights are substantially unequal to each other.

When the tip portion probes the device under test, stress will concentrate at the first and second transition segments and the first and second lower plane segments, making these segments relatively more prone to fracture. The present invention addresses this issue by designing the first and second lower boundary lines at different heights, meaning that the heights of the first and second lower plane segments are unequal, which helps to alleviate stress concentration, making the vertical probe less prone to fracture.

Preferably, the tip portion has a contact end furthest from the body. The distance between the first upper boundary line and the contact end along the longitudinal axis is defined as a third height, while the distance from the second upper boundary line to the contact end along the longitudinal axis is defined as a fourth height. The third and fourth heights are substantially unequal to each other.

By designing the first and second upper boundary lines at different heights, i.e., the total height of the first lower plane segment and the first transition segment differs from the total height of the second lower plane segment and the second transition segment, the stress concentration problem can also be improved, making the vertical probe even less prone to fracture. The present invention can also arrange the first and second lower boundary lines at different heights, while the first and second upper boundary lines are also positioned at different heights, further improving the stress concentration problem to make the vertical probe less prone to fracture.

Preferably, the distance between the second upper boundary line and the second lower boundary line is greater than the distance between the first upper boundary line and the first lower boundary line.

Consequently, the length of the second transition segment is greater than that of the first transition segment, allowing the second transition segment to better distribute stress than the first transition segment. In cases where the upper and lower die units of the probe seat offset only along a single horizontal axis or where they offset along two horizontal axes with different displacement amounts among the two horizontal axes, the vertical probe will experience greater stress in the direction with the relatively larger displacement. Thus, the longer second transition segment can be arranged to face the direction with the relatively larger displacement to achieve better stress dispersion. Additionally, the lengths of the first and second transition segments can be designed based on the predetermined relative displacement amounts of the upper and lower die units along the two horizontal axes, thereby further improving the stress concentration problem to make the vertical probe less prone to fracture.

Preferably, each of the first, second, third, and fourth sides at the body has a width ranging from 30 micrometers to 100 micrometers.

Therefore, before reducing the width and thickness of the tip portion (i.e., before forming the first and second transition segments and the first and second lower plane segments), each side of the vertical probe has a width of 30 μm to 100 μm, which is suitable for machining the first and second transition segments and the first and second lower plane segments to reduce the width and thickness of the tip portion.

Preferably, the tip portion comprises a tip tapering section and a tip contact section. The tip tapering section comprises the first and second transition segments, while the tip contact section comprises the first and second lower plane segments. The tip contact section has a square cross-section and the body has a square cross-section.

As a result, the vertical probe has equal reduction amounts in width and thickness at the tip portion, thereby preventing a relatively greater stress concentration in one of the horizontal axes.

Preferably, the tip portion comprises a tip tapering section and a tip contact section. The tip tapering section comprises the first and second transition segments, while the tip contact section comprises the first and second lower plane segments. The second upper plane segment and the second lower plane segment of the second side are perpendicular to a first horizontal axis, while the first upper plane segment and the first lower plane segment of the first side are perpendicular to a second horizontal axis. The distance between the first upper plane segment and the first lower plane segment of the first side along the second horizontal axis is greater than the distance between the second upper plane segment and the second lower plane segment of the second side along the first horizontal axis.

As a result, the cross-section of the body has a rectangular shape having the short side on the first side and the long side on the second side, and the tip portion has a reduction amount at the first side greater than that at the second side, such that the tip portion has a smaller stress concentration at the second side. The second side may be arranged facing the horizontal axis along which the upper and lower die units have a relatively greater displacement amount, thereby making the vertical probe less prone to fracture. Additionally, the short side of the cross-section of the body is parallel to the horizontal axis along which the upper and lower die units have a relatively greater displacement amount, thereby producing a better elastic deformation effect.

To attain the above objective, the probe head provided by the present invention comprises an upper die unit, a lower die unit, and a vertical probe as previously described. The upper die unit includes an upper guide hole, and the lower die unit includes an upper surface, a lower surface, and a lower guide hole penetrating through the upper surface and the lower surface. The upper surface of the lower die unit faces the upper die unit. The body of the vertical probe comprises an upper mounting part and a lower mounting part. The upper mounting part and the lower mounting part are inserted into the upper guide hole and the lower guide hole, respectively, such that the tip portion is located below the lower surface of the lower die unit.

As a result, the vertical probe in the probe head provided by the present invention has the structural characteristics described above. It meets the requirements for probing small conductive contacts while also offering excellent current-withstanding capacity, structural strength, and durability, as well as achieving high processing accuracy. Furthermore, the lower mounting part of the vertical probe can be abutted against the inner surface of the lower guide hole by the third side and/or the fourth side having the planar shape, reducing the likelihood of fracture due to vertical movement of the tip portion and preventing the position of the tip portion from misalignment with the conductive contact of the device under test.

Preferably, the probe head defines a first horizontal axis and a second horizontal axis, which are perpendicular to each other. The upper and lower guide holes are displaced relative to each other along the first horizontal axis to result in that the fourth side of the vertical probe is abutted against an inner surface of the lower guide hole.

As a result, when the upper and lower die units are displaced along the first horizontal axis, causing the upper and lower guide holes to offset from each other in the first horizontal axis, the vertical probe is abutted against the inner surface of the lower guide hole by the fourth side having a planar shape. Accordingly, even if the tip portion moves up and down and retracts into the lower guide hole when probing the device under test, the tip portion will not be prone to fracture, and the position of the tip portion is prevented from offset to cause misalignment with the conductive contact of the device under test.

Preferably, the upper and lower guide holes are also displaced relative to each other along the second horizontal axis to result in that the third side of the vertical probe is abutted against another inner surface of the lower guide hole.

As a result, when the upper and lower die units are relatively displaced along both the first and second horizontal axes, causing the upper and lower guide holes to offset from each other in both the first and second horizontal axes, the vertical probe is abutted against the inner surfaces of the lower guide hole by the third and fourth sides having a planar shape. Thus, even if the tip portion moves up and down and retracts into the lower guide hole when probing the device under test, the tip portion will not be prone to fracture, and the position of the tip portion is prevented from offset to cause misalignment with the conductive contact of the device under test.

Preferably, the upper and lower guide holes are displaced relative to each other along the first horizontal axis at a distance greater than a distance at which the upper and lower guide holes are displaced relative to each other along the second horizontal axis.

As a result, the relatively greater displacement amount between the upper and lower die units along the first horizontal axis causes a larger offset distance of the upper and lower guide holes in the first horizontal axis. This feature primarily causes elastic bending deformation of the body of the vertical probe along the first horizontal axis, and the first and second transition segments can be designed based on this feature. For instance, the length of the second transition segment can be configured as being greater than that of the first transition segment, thereby improving the stress concentration problem and making the vertical probe less prone to fracture.

Preferably, the probe head further comprises an another vertical probe, which comprises a body extending along another longitudinal axis and having an elongated shape, and a tip portion connected with and extending from the body of the another vertical probe along the another longitudinal axis. The another vertical probe includes a first side, a second side, a third side opposite to the first side, and a fourth side opposite to the second side. Each of the first side, the second side, the third side, and the fourth side of the another vertical probe extends in a planar manner from the body of the another vertical probe to the tip portion of the another vertical probe. The body of the another vertical probe includes an upper mounting part inserted into an another upper guide hole of the upper die unit, and a lower mounting part inserted into an another lower guide hole of the lower die unit, such that the tip portion of the another vertical probe is located below the lower surface of the lower die unit.

In other words, the tip portion of the another vertical probe (hereafter referred to as the "second vertical probe") has non-reduced thickness and width equal to that of the body. Compared to the vertical probe (hereinafter referred to as the "first vertical probe"), where the tip portion has reduced thickness and width mentioned above, the contact end of the tip portion of the second vertical probe has a relatively larger area, making this probe head suitable for testing the device under test with micro bumps. The contact end of the tip portion of the second vertical probe can simultaneously contact a plurality of micro bumps used for transmitting power or ground signals, while the contact end of the tip portion of the first vertical probe contacts a single micro bump used for transmitting test signal. As a result, even though the tip portions of the first and second vertical probes have different dimensions, the bodies have a same dimension, such that it is easy to control that the bodies of the first and second vertical probes have a same deformation to produce uniform probe testing performance and wearing rate of the first and second vertical probes. Moreover, since the micro bumps of the device under test are usually arranged in a matrix, the reduction in width and thickness of the tip portion of the first vertical probe enables the tip portion of the first vertical probe to align precisely with a single micro bump, and under this condition the bodies of the first and second vertical probes can still be lined up relative to each other, such that the lower guide holes adapted for insertions of the first and second vertical probes can also be lined up relative to each other without the need of designing different arrangements of lower guide holes for the first and second vertical probes. This simplifies the design of the lower guide holes and prevents damage to the plate of the lower die unit due to complex arrangements or inconsistent pitches of the lower guide holes.

Preferably, the probe head defines a first horizontal axis and a second horizontal axis, which are perpendicular to each other. The upper and lower guide holes are displaced relative to each other along the first horizontal axis, causing that the fourth sides of the vertical probe and the another vertical probe are abutted against inner surfaces of the lower guide holes. Additionally, the upper and lower guide holes are also displaced relative to each other along the second horizontal axis, causing that the third sides of the vertical probe and the another vertical probe are abutted against another inner surfaces of the lower guide holes. The upper guide hole and the lower guide hole are displaced relative to each other along the first horizontal axis at a distance greater than a distance at which the upper guide hole and the lower guide hole are displaced relative to each other along the second horizontal axis.

Therefore, under the condition that the upper and lower guide holes offset from each other along both the first and second horizontal axes, the vertical probes are abutted against the inner surfaces of the lower guide holes by the third and fourth sides having a planar shape. Thus, even if the tip portions move up and down and retract into the lower guide holes when probing the device under test, the tip portions will not be prone to fracture, and the positions of the tip portions are prevented from offset to cause misalignment with the conductive contacts of the device under test. Additionally, a larger offset distance of the upper and lower guide holes in the first horizontal axis results in elastic bending deformation of the bodies of the vertical probes primarily along the first horizontal axis. As such, the first and second transition segments can be designed based on aforesaid feature. For instance, the length of the second transition segment can be configured as being greater than that of the first transition segment, thereby improving the stress concentration problem and making the vertical probe less prone to fracture.

To achieve the above objective, the present invention provides a method of making the vertical probe as previously described, which is characterized in that the first transition segment is formed by a laser processing (such as laser ablation) between a first position and a second position on a top surface of a substrate made of a conductive material. The first lower plane segment is formed by the laser processing between the second and a third position on the top surface of the substrate.

Consequently, the first side of the vertical probe is processed by the laser processing to from the first transition segment and the first lower plane segment, ensuring high dimensional accuracy of the tip portion and thus meeting tolerance requirements of the vertical probe, thereby improving the manufacturing yield of the probe card.

Preferably, the method of making the vertical probe is further characterized in that the second transition segment and second lower plane segment of the second side are formed by a laser processing (such as laser cutting) on the substrate. This enhances the dimensional accuracy of the tip portion, further improving the manufacturing yield of the probe card.

In an embodiment of the present invention, the method of making the vertical probe comprises the steps of:

- providing a substrate, which is a plate having a top surface and a bottom surface opposite the top surface;
- processing the top surface of the substrate between a first position and a second position by the laser processing to form a transition surface that gradually approaches the bottom surface from the first position to the second position;
- processing the top surface of the substrate between the second position and a third position by the laser processing to form a process plane; and
- cutting the substrate into at least one vertical probe by a cutting processing in a way that the first upper plane segment of the first side of the vertical probe is formed an unprocessed portion of the top surface of the substrate, the first transition segment is formed by the transition surface of the substrate, the first lower plane segment is formed by the process plane of the substrate, and the second and fourth sides are formed by the cutting processing.

With the above steps, the vertical probe provided by the present invention can be made from a plate through laser processing (such as laser ablation) and cutting processing. By means of laser processing on the top surface of the plate to form the transition surface and process plane, the reduction of the thickness of the tip portion in the subsequently cutting-formed vertical probe can be achieved, while the bottom surface of the plate can remain flat to serve as the third side of the vertical probe. This manufacturing method not only enables the production of the vertical probe having the above-mentioned effects but also allows multiple probes to be cut from the plate that has been processed by the laser processing, making the production process convenient and efficient.

Preferably, the cutting procedure is performed by using a laser processing (such as laser cutting), further improving the dimensional accuracy of the vertical probe and thus enhancing the manufacturing yield of the probe card.

Preferably, the distance along the longitudinal axis between the second upper boundary line of the second side formed by the cutting processing and the third position is substantially different from the distance between the first and third positions along the longitudinal axis. Alternatively, the distance along the longitudinal axis between the second lower boundary line of the second side formed by the cutting processing and the third position is substantially different from the distance between the second and third positions. In this way, the second upper boundary line of the second side is not aligned with the first upper boundary line of the first side, or the second lower boundary line of the second side is not aligned with the first lower boundary line of the first side, thereby improving the stress concentration problem of the first and second transition segments and the first and second lower plane segments to make the vertical probe less prone to fracture.

In another embodiment of the present invention, the method of making the vertical probe comprises the steps of:

providing a substrate in the form of an elongated needle body including the second side of the vertical probe;

processing the top surface of the substrate between a first position and a second position by a laser processing to form the first transition segment, and processing the top surface of the substrate between the second position and a third position by the laser processing to form the first lower plane segment in a way that the top surface of the substrate forms the first side of the vertical probe.

With the above steps, the vertical probe provided by the present invention can be made from an elongated needle body through laser processing. The needle body can be formed by micro-electromechanical systems or other methods, thereby creating the required side profile for the vertical probe. The needle body can thus include the second upper plane segment, second transition segment, and second lower plane segment of the second side of the vertical probe. The top and bottom surfaces of the needle body may be made in a flat manner, and the above-mentioned method achieves the reduction of the thickness of the tip portion by forming the first transition segment and the first lower plane segment on the top surface, while the bottom surface, which is opposite to the top surface, remains flat, serving as the third side of the vertical probe. Such method can make a vertical probe having the effects mentioned above.

Preferably, the distance along the longitudinal axis between the first and third positions is substantially different from the distance between the second upper boundary line of the second side and the third position. Alternatively, the distance along the longitudinal axis between the second and third positions is substantially different from the distance between the second lower boundary line of the second side and the third position.

As a result, the first transition segment formed by the laser processing on the top surface of the needle body has a starting position differs from the starting position of the second transition segment of the second side, such that the boundary lines between the first transition segment and the first upper plane segment and between the second transition segments and the second upper plane segment are not aligned with each other. Alternatively, the end position of the first transition segment differs from the end position of the second transition segment, such that the boundary lines between the first transition segment and the first lower plane segment and between the second transition segments and the second lower plane segment are not aligned with each other. In this way, the stress concentration problem of the first and second transition segments and the first and second lower plane segments can be improved, thereby making the vertical probe less prone to fracture. The present invention can also be configured in a way that the boundary lines between the first transition segment and the first upper plane segment and between the second transition segments and the second upper plane segment are not aligned with each other, and the boundary lines between the first transition segment and the first lower plane segment and between the second transition segments and the second lower plane segment are not aligned with each other. In this way, the stress concentration problem of the first and second transition segments and the first and second lower plane segments can be further improved, thereby making the vertical probe less prone to fracture.

The detailed structure, features, assembly, and usage of the vertical probe, probe head, and method of making the vertical probe provided by the present invention will be described in detail in the following embodiments. However, those skilled in the art will understand that the specific embodiments and descriptions are intended to illustrate the invention and are not meant to limit the scope of the patent claims.

DETAILED DESCRIPTION OF THE INVENTION

The applicant is to be firstly mentioned that in the following embodiments and drawings, identical reference numbers indicate identical or similar elements or structural features thereof. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 1:
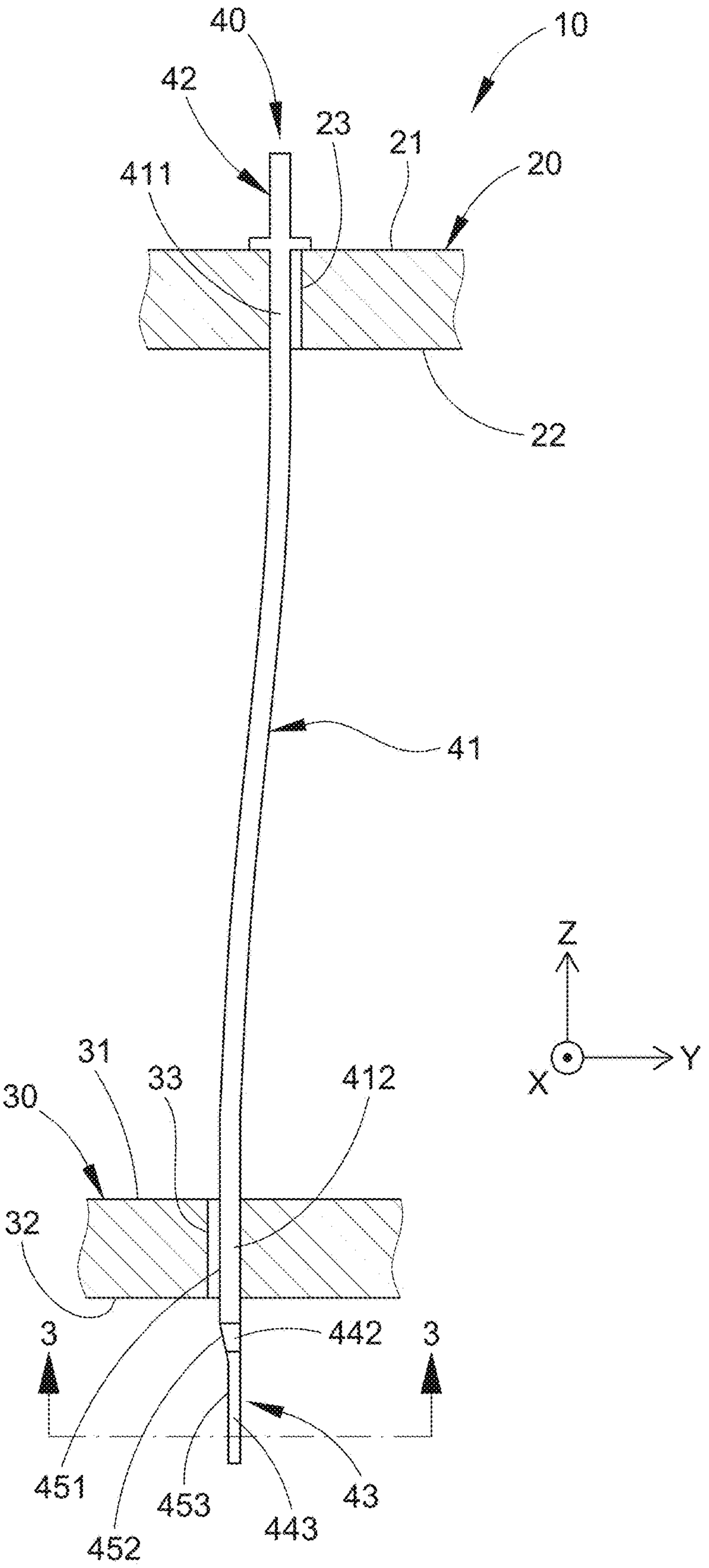
FIG. 1 is a schematic cross-sectional view of a probe head provided in accordance with a first preferred embodiment of the present invention.

Referring to FIG. 1, a probe head 10 provided in accordance with a first preferred embodiment of the present invention is composed of an upper die unit 20, a lower die unit 30, and one or more vertical probes 40.

In this embodiment, each of the upper and lower die units 20, 30 includes a single plate. However, the upper die unit 20 and/or the lower die unit 30 may also be composed of multiple stacked plates. The edges of the upper and lower die units 20, 30 may have protruding structures for direct interconnection, or a hollow middle die (not shown) may be connected between the upper die unit 20 and the lower die unit 30. The upper die unit 20 includes an upper surface 21, a lower surface 22, and one or more upper guide holes 23 penetrating through the upper surface 21 and the lower surface 22. The lower die unit 30 includes an upper surface 31, a lower surface 32, and one or more lower guide holes 33 penetrating through the upper surface 31 and the lower surface 32.

Figure 2:
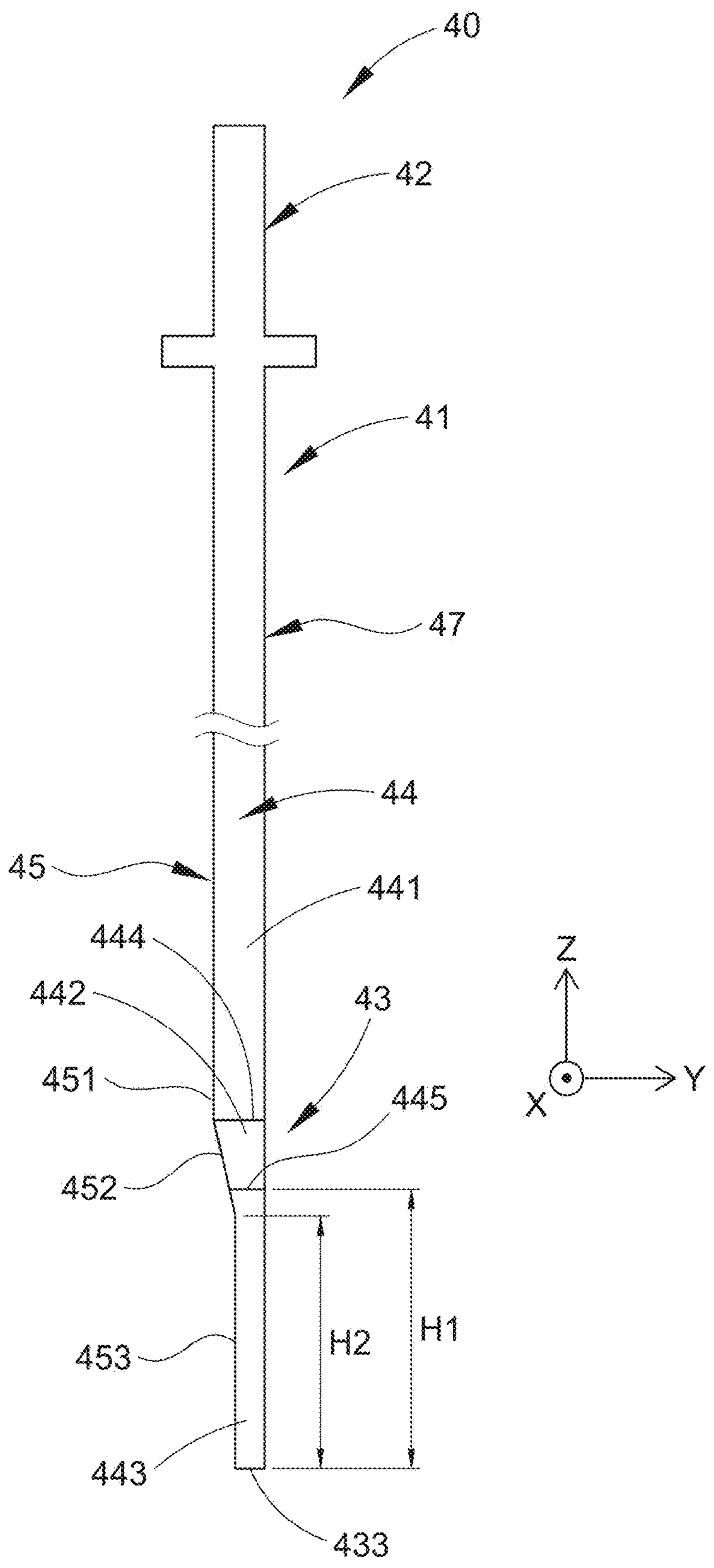
FIG. 2 is a schematic plan view of a vertical probe provided by the first preferred embodiment of the present invention.

During assembly of the probe head 10, the upper and lower die units 20, 30 are initially positioned relative to each other without being fixed in a way that the upper surface 31 of the lower die unit 30 faces the lower surface 22 of the upper die unit 20 and the upper guide hole 23 and the lower guide hole 33 are aligned coaxially. As shown in FIG. 2, the vertical probe 40, initially straight, is inserted from top to bottom through the coaxially aligned upper and lower guide holes 23, 33. Then, the upper and lower die units 20, 30 are relatively moved along a first horizontal axis (Y-axis), causing the upper and lower guide holes 23, 33 to be offset along the Y-axis, resulting in the bent shape of the vertical probe 40 as shown in FIG. 1. The upper and lower die units 20, 30 may also be moved relative to each other along a second horizontal axis (X-axis), creating additional offset for upper and lower guide holes 23, 33 along the X-axis. In this embodiment, the offset distance between the upper and lower guide holes 23, 33 along the Y-axis is greater than the offset distance between the upper and lower guide holes 23, 33 along the X-axis, causing the primary bending of the vertical probe 40 to occur along the Y-axis. Thereafter, the upper and lower die units 20, 30 will be fixed together, ensuring that the vertical probe 40 remains in the bent state shown in FIG. 1.

As shown in FIG. 2, the vertical probe 40 includes a body 41 extending along a longitudinal axis (Z-axis) and having an elongated shape, a needle tail 42 integrally connected with and extending upward from the body 41 along the Z-axis, and a tip portion 43 integrally connected with and extending downward from the body 41 along the Z-axis. As shown in FIG. 1, the portion of the body 41, which is connected with the needle tail 42, serves as an upper mounting part 411, which is inserted into the upper guide hole 23. The portion of the body 41, which is connected with the tip portion 43, serves as a lower mounting part 412, which is inserted into the lower guide hole 33 in a way that the lower mounting part 412 extends partially below the lower surface 32 of the lower die unit 30, such that the tip portion 43 is located below the lower surface 32 of the lower die unit 30.

Figure 3:
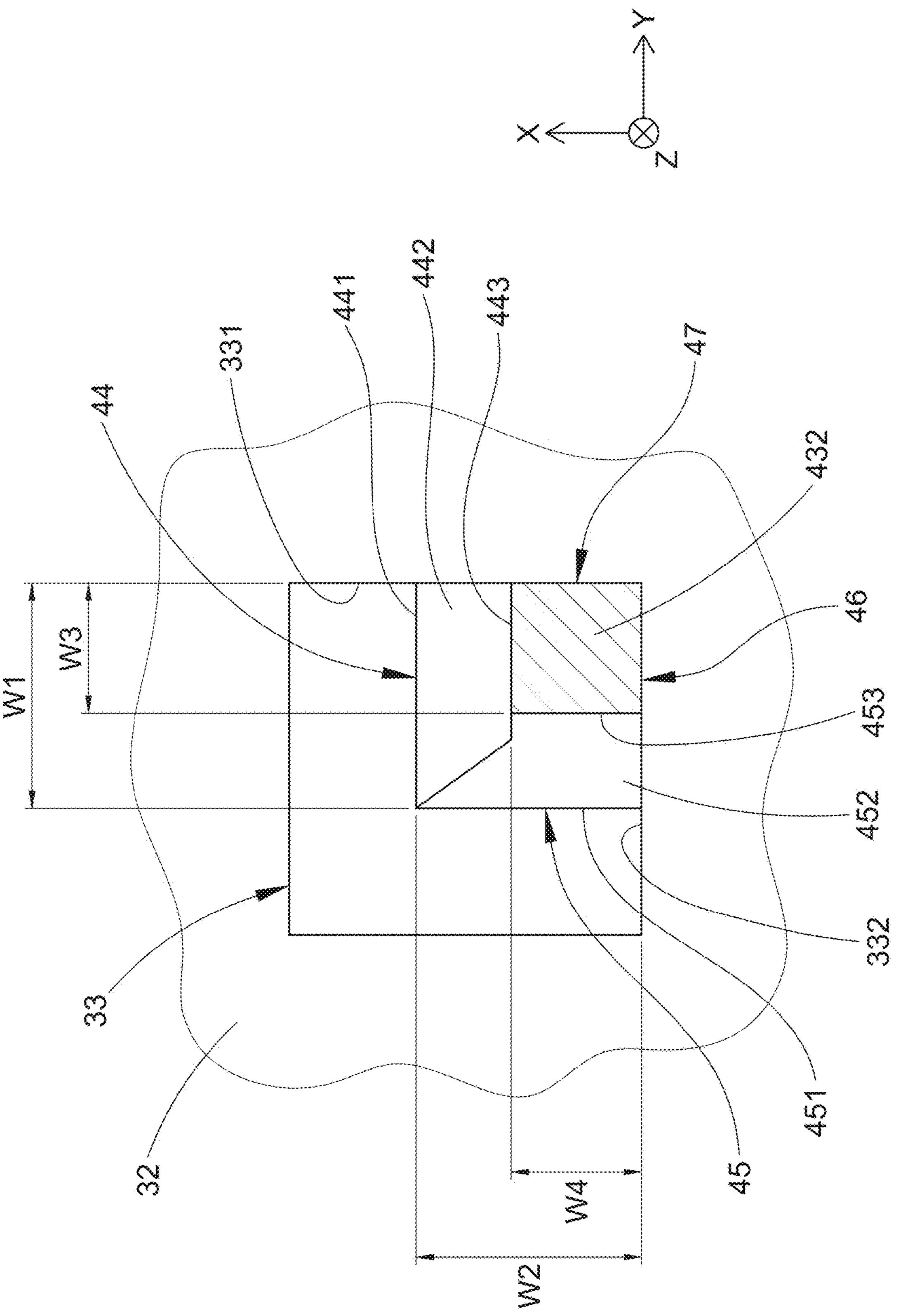
FIG. 3 is a cross-sectional view of the probe head of the first preferred embodiment of the present invention taken along line 3-3 of FIG. 1.
Figure 4:
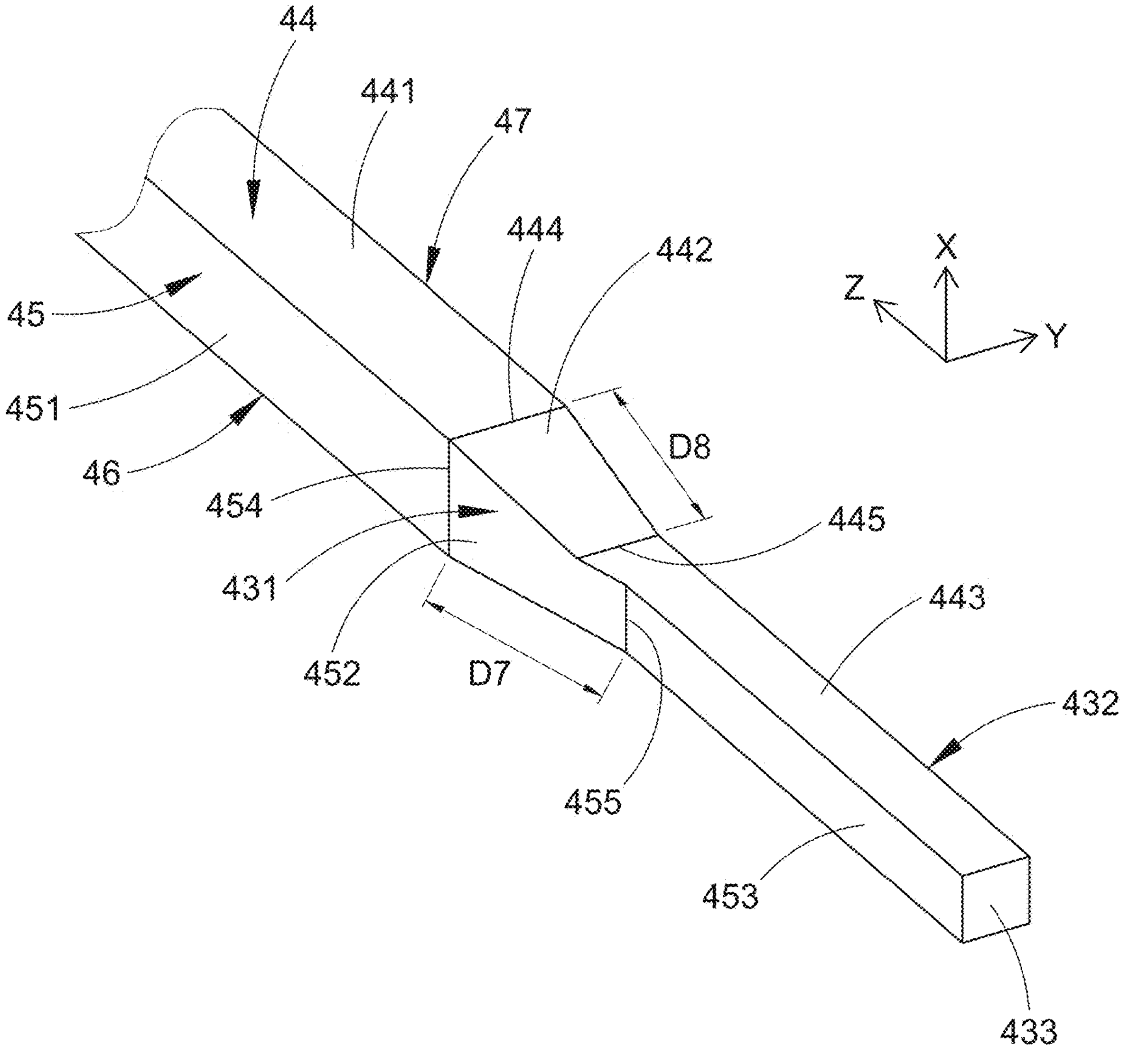
FIG. 4 is a schematic perspective view of the vertical probe provided by the first preferred embodiment of the present invention.
Figure 5:
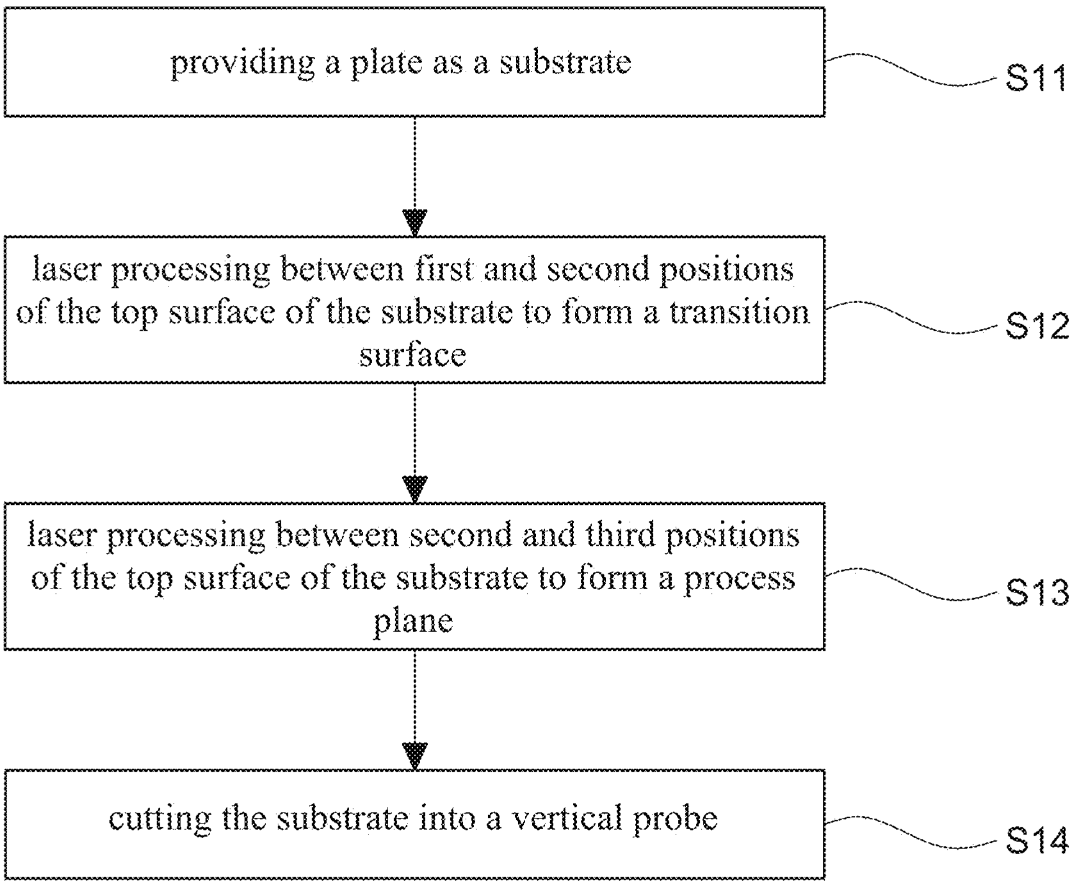
FIG. 5 is a flowchart showing a method of making the vertical probe provided by the first preferred embodiment of the present invention.

Referring to FIGS. 2 to 4, the vertical probe 40 includes a first side 44, a second side 45, a third side 46 opposite to the first side 44, and a fourth side 47 opposite to the second side 45. The third side 46 and the fourth side 47 extend in a planar manner from the body 41 to the tip portion 43. More specifically, the portion of the third side 46 on the body 41 and the portion of the third side 46 on the tip portion 43 are coplanar and parallel to the Y-axis and Z-axis, i.e., located on the Y-Z plane. Similarly, the portion of the fourth side 47 on the body 41 and the portion of the fourth side 47 on the tip portion 43 are coplanar and parallel to the X-axis and Z-axis, i.e., located on the X-Z plane. It should be noted that on the third side 46 and the fourth side 47, not every part of the body 41 must be coplanar with the tip portion 43; however, at least the part of the body 41 connected with the tip portion 43 is in a coplanar manner. As such, the configuration that the third side 46 and the fourth side 47 extend in a planar manner from the body 41 to the tip portion 43 is specifically directed to the part of the body 41 that is connected with the tip portion 43. Generally, as shown in FIG. 1, the part of the body 41 connected with the tip portion 43 may be the lower mounting part 412 of the body 41, or the part where the lower mounting part 412 partially extends below the lower surface 32 of the lower die unit 30. Conversely, the first side 44 and the second side 45 do not extend entirely in a planar manner from the body 41 to the tip portion 43, as will be detailedly illustrated below.

The first side 44 includes a first upper plane segment 441 located at the body 41, and a first transition segment 442 and a first lower plane segment 443 both located at the tip portion 43. The first transition segment 442 is located between the first upper plane segment 441 and the first lower plane segment 443. The first upper plane segment 441 and the first lower plane segment 443 are perpendicular to the X-axis, while the first transition segment 442 is inclined relative to the first upper plane segment 441 and the first lower plane segment 443. The first upper plane segment 441 and the first transition segment 442 are defined with a first upper boundary line 444 therebetween, and the first transition segment 442 and the first lower plane segment 443 are defined with a first lower boundary line 445 therebetween. The first lower plane segment 443 is closer to the third side 46 than the first upper plane segment 441 is. The first transition segment 442 extends from the first upper boundary line 444 to the first lower boundary line 445 in a way that the first transition segment 442 gradually approaches the third side 46. In other words, if the distance between the first side 44 and the third side 46 along the X-axis is defined as thickness, the thickness of the body 41 is greater than that of the tip portion 43, and the tip portion 43 gradually reduces in thickness within the first transition segment 442 and maintains a uniform thickness in the first lower plane segment 443.

The second side 45 includes a second upper plane segment 451 located at the body 41, and a second transition segment 452 and a second lower plane segment 453 both located at the tip portion 43. The second transition segment 452 is located between the second upper plane segment 451 and the second lower plane segment 453. The second upper plane segment 451 and the second lower plane segment 453 are perpendicular to the Y-axis, while the second transition segment 452 is inclined relative to the second upper plane segment 451 and the second lower plane segment 453. The second upper plane segment 451 and the second transition segment 452 are defined with a second upper boundary line 454 therebetween, and the second transition segment 452 and the second lower plane segment 453 are defined with a second lower boundary line 455 therebetween. The second lower plane segment 453 is closer to the fourth side 47 than the second upper plane segment 451 is. The second transition segment 452 extends from the second upper boundary line 454 to the second lower boundary line 455 in a way that the second transition segment 452 gradually approaches the fourth side 47. In other words, if the distance between the second side 45 and the fourth side 47 along the Y-axis is defined as width, the width of the body 41 is greater than that of the tip portion 43, and the tip portion 43 gradually reduces in width within the second transition segment 452 and maintains a uniform width in the second lower plane segment 453.

Therefore, the part of the tip portion 43, which includes the first and second transition segments 442, 452, is formed as a tip tapering section 431, and the part of the tip portion 43, which includes the first and second lower plane segments 443, 453, is formed as a tip contact section 432. The tip tapering section 431 is located between the body 41 and the tip contact section 432, and the tip tapering section 431 has a cross-sectional area gradually decreasing from the body 41 to the tip contact section 432. The end of the tip contact section 432 serves as a contact end 433, which the point on the tip portion 43 furthest from the body 41. The contact end 443 is used to contact a conductive contact on the device under test (not shown). The tip tapering section 431 allows for the gradual reduction of thickness and width to the required dimensions, ensuring that the thickness and width of the tip contact section 432 meet the requirements for contacting small conductive contacts. Meanwhile, the body 41 retains a relatively larger width and thickness, providing the vertical probe 40 with good current-withstanding capacity, structural strength, and durability. In this embodiment, the first and second transition segments 442, 452 are inclined planes, but they are not limited to be the inclined planes as long as they gradually reduce in thickness and width. For example, they may have a stepped shape.

Referring to FIGS. 5 to 8, the method of making the vertical probe 40 includes the following steps S11 to S14.

Figure 6:
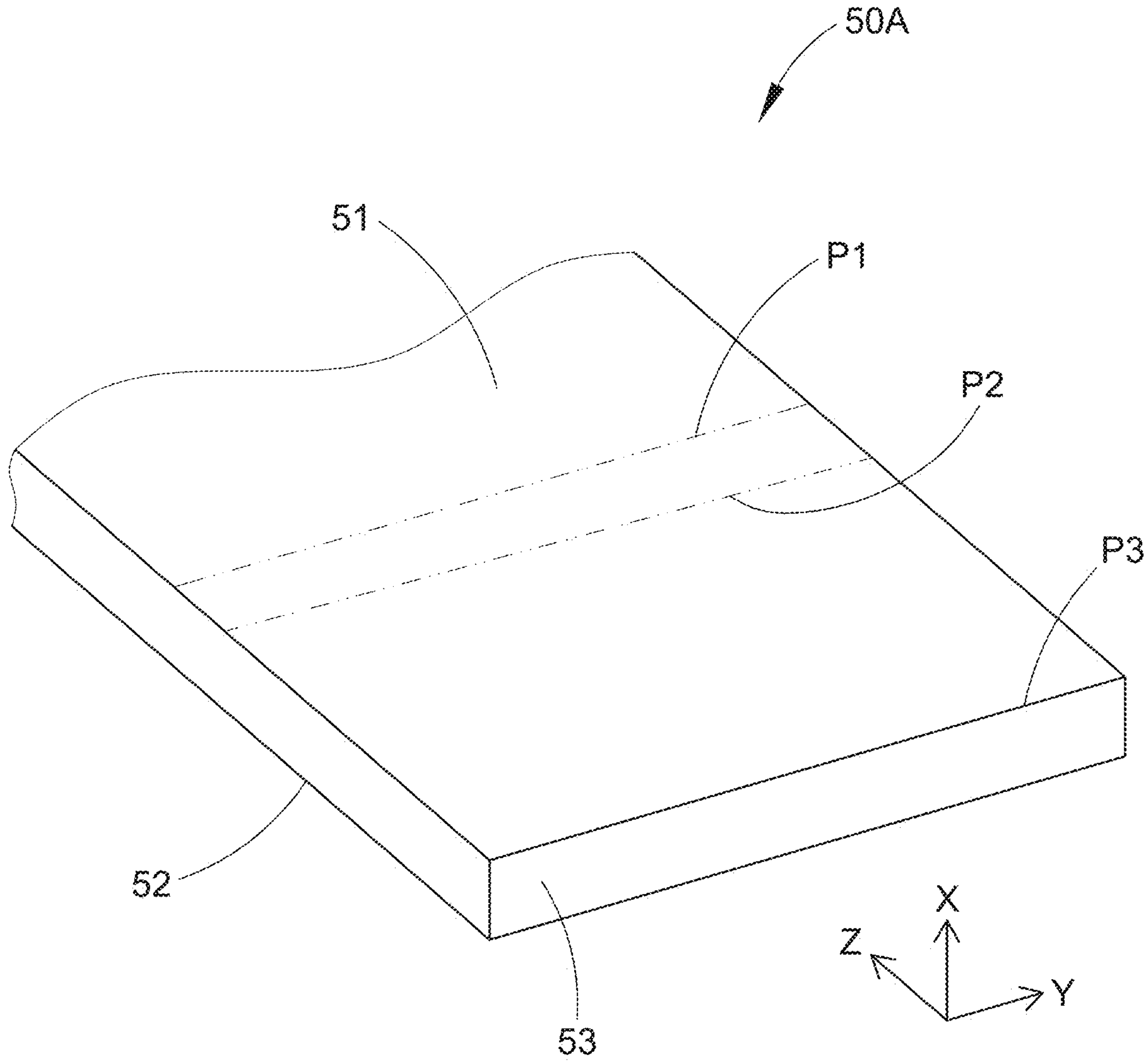
FIGS. 6 to 8 are schematics perspective views showing the steps of making the vertical probe provided by the first preferred embodiment of the present invention.
Figure 7:
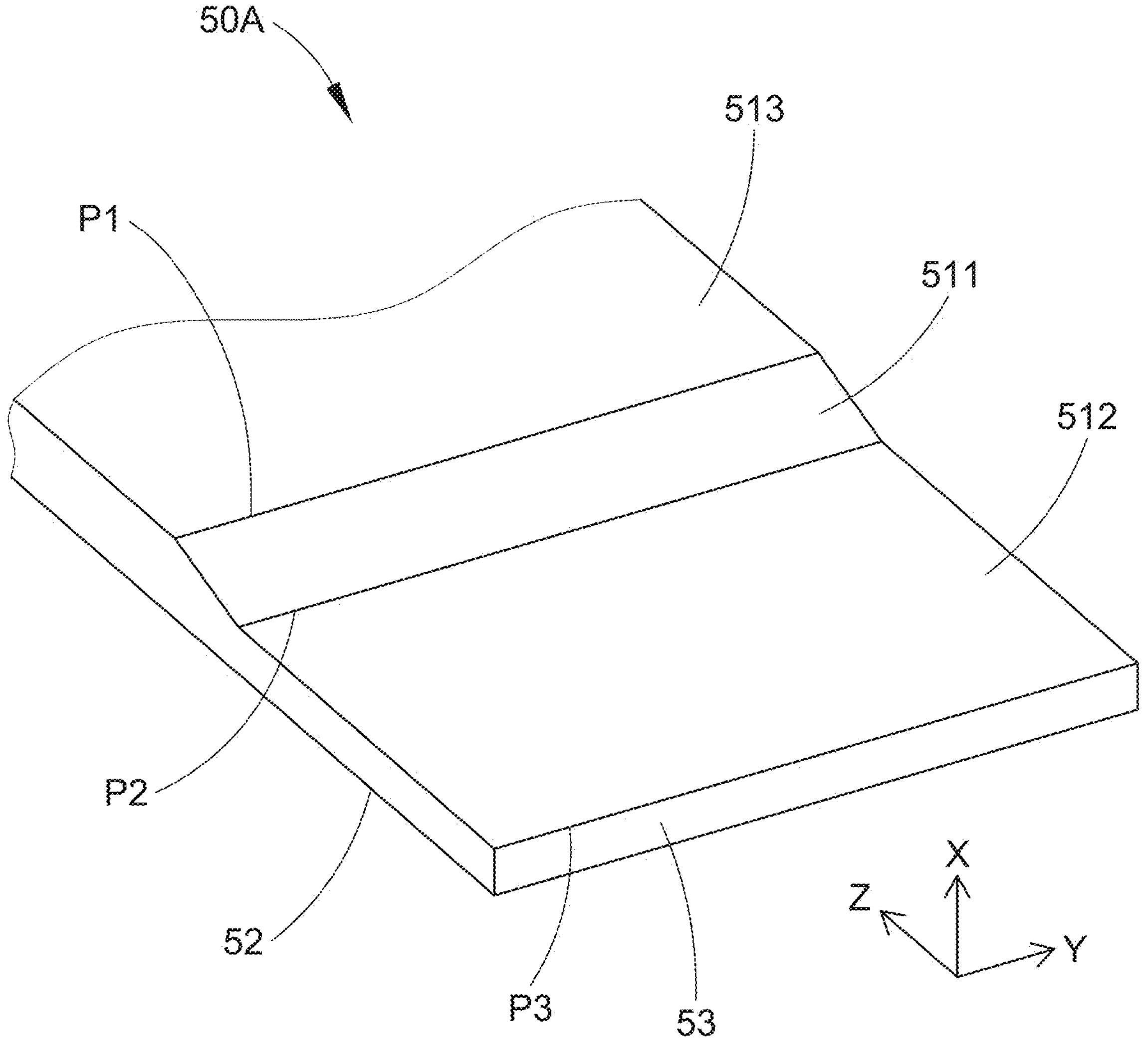

Step S11 involves providing a substrate 50A (as shown in FIG. 6), which is a plate made of conductive material. The substrate 50A has a top surface 51 and a bottom surface 52 opposite to the top surface 51. For example, the substrate 50A may be made from alloy or electroplated plates with an elongated shape. for example, the plate may be made by Micro-Electro-Mechanical Systems processing or thermal metal rolling.

Step S12 involves using a laser processing (such as laser ablation) on the top surface 51 of the substrate 50A, between a first position P1 and a second position P2, to form a transition surface 511. The transition surface 511 gradually approaches the bottom surface 52, extending from the first position P1 to the second position P2. The transition surface 511 does not have to be an inclined plane as long as the thickness of the substrate can be gradually reduced. For example, the transition surface 511 may have a stepped shape.

Step S13 involves using the above-mentioned laser processing on the top surface 51 of the substrate 50A between the second position P2 and a third position P3 to form a process plane 512. In other words, after completing step S12, step S13 is continuously performed with the same laser processing to form the process plane 512. The starting position of the process plane 512 is the end position of the transition surface 511 (i.e., the second position P2), while the end position of the process plane 512 (i.e., the third position P3) is located at an end face 53 of the substrate 50A. The laser processing described in steps S12 and S13 (such as laser ablation) involves using a laser to directly ablate the substrate 50A, thinning the substrate 50A with the laser's energy.

Figure 8:
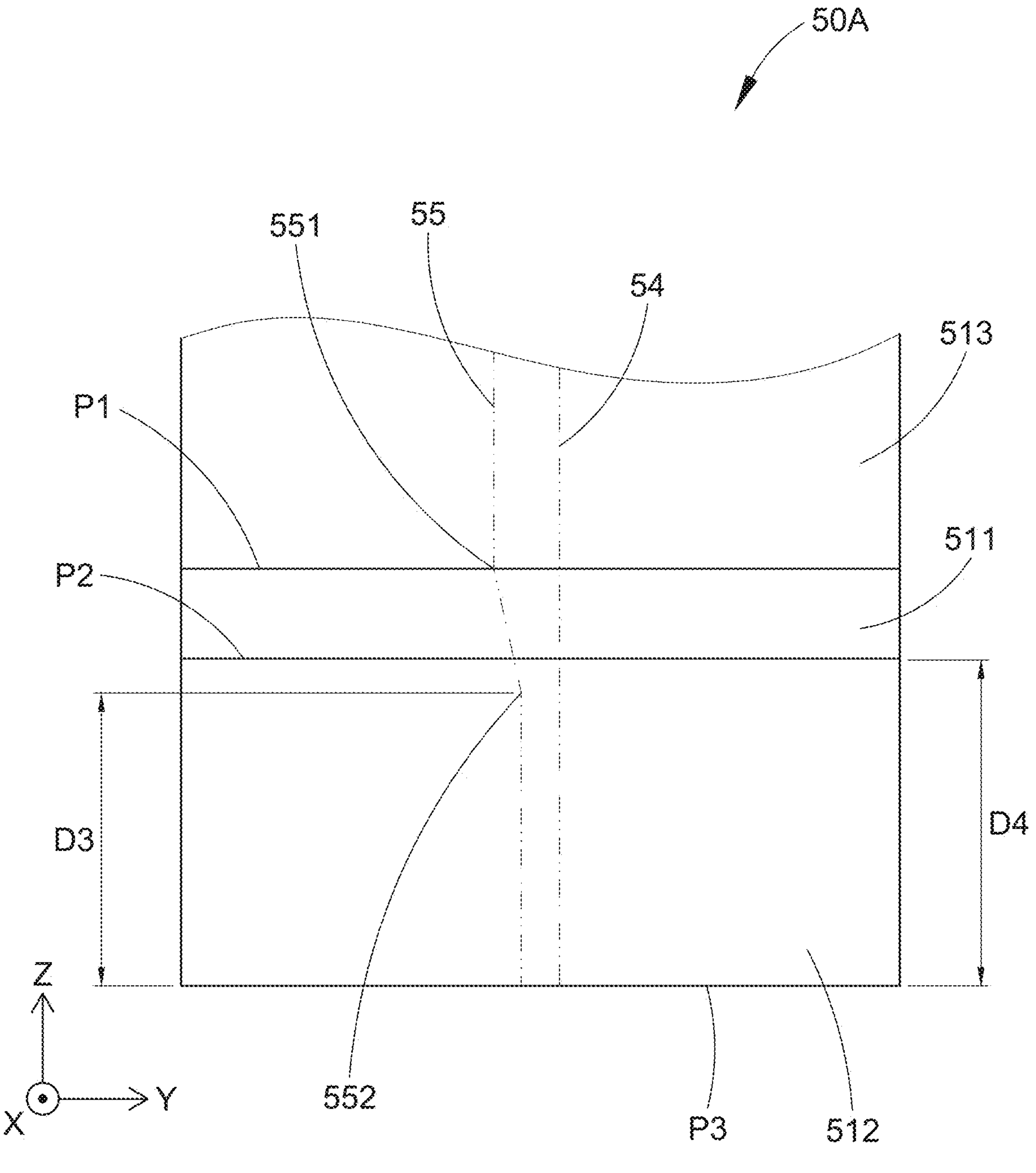

Step S14 is to perform a cutting processing to cut the substrate 50A into at least one vertical probe 40. For example, the substrate 50A is cut along two cutting paths 54 and 55, as shown in FIG. 8, to produce the vertical probe 40 as shown in FIG. 2. In this way, the first upper plane segment 441 of the first side 44 of the vertical probe 40 is formed from the unprocessed portion of the top surface 51 of the substrate 50A (i.e. the flat plane 513 shown in FIGS. 7 and 8), the first transition segment 442 is formed from the transition surface 511 of the substrate 50A, and the first lower plane segment 443 is formed from the process plane 512 of the substrate 50A. Furthermore, the second side 45 and the fourth side 47 are formed by the cutting processing. Specifically, the cutting paths 54 and 55, as shown in FIG. 8, form the fourth side 47 and second side 45 of the vertical probe 40, respectively. The cutting path 55 has two turning points 551 and 552, allowing for the creation of the second upper plane segment 451, the second transition segment 452, and the second lower plane segment 453 of the second side 45. This cutting processing may be performed by a laser processing method, such as laser cutting.

In this invention, the tip portion 43 of the vertical probe 40 is designed being non-coplanar with the body 41 at the first side 44 and the second side 45 only, and remaining coplanar with the body 41 at the third side 46 and the fourth side 47. Therefore, as shown in FIGS. 1 and 3, the vertical probe 40 can be installed in the lower die unit 30 in a way that the second side 45 faces the direction (i.e., negative Y-axis direction) of the offset of the lower guide hole 33 relative to the upper guide hole 23 along the first horizontal axis, causing the fourth side 47 to be abutted against the inner surface 331 of the lower guide hole 33 facing the negative Y-axis direction. Under the circumstance that the upper guide hole 23 and the lower guide hole 33 are also offset along the second horizontal axis, the first side 44 will face the offset direction (i.e., positive X-axis direction) of the lower guide hole 33 relative to the upper guide hole 23 along the second horizontal axis, causing the third side 46 to be abutted against another inner surface 332 of the lower guide hole 33 facing the positive X-axis direction.

Thus, the vertical probe 40 is abutted against the inner surfaces 332 and/or 331 of the lower guide hole 33 with the flat-shaped third side 46 and/or fourth side 47. In the third side 46 and the fourth side 47, there is no height difference between the body 41 and the tip portion 43, providing relatively high structural strength in this section. Therefore, when the contact end 433 of the tip portion 43 probes the conductive contact on the device under test, the tip portion 43 will not easily fracture due to the grounds that the tip portion 43 moves up and down and retracts into the lower guide hole 33. This design also avoids the position of the tip portion 43 from offset to cause misalignment of the contact end 433 with the conductive contact on the device under test. Additionally, the first side 44 of the vertical probe 40 is laser-processed to form the first transition segment 442 and the first lower plane segment 443, ensuring good dimensional accuracy of the tip portion 43. Similarly, the second transition segment 452 and the second lower plane segment 453 of the second side 45 can also be formed through laser processing, further improving the dimensional accuracy of the tip portion 43, allowing the vertical probe 40 to meet tolerance requirements and enhancing the production yield of the probe card.

It is worth mentioning that while the probe head 10 in this embodiment includes upper and lower die units 20 and 30 through which the vertical probe 40 is inserted, the probe head 10 may be configured without the upper die unit 20. In such cases, as long as the vertical probe 40 is inserted into the lower guide hole 33 in the lower die unit 30 to enable the third side 46 and/or the fourth side 47 to be abutted against the inner surfaces 332 and/or 331 of the lower guide hole 33, the effects of the vertical probe 40 described in this invention can still be achieved.

Preferably, as shown in FIG. 3, the width W1 of the first side 44 and third side 46 at the body 41 is between 30 and 100 micrometers, and the width W2 of the second side 45 and fourth side 47 at the body 41 is also between 30 and 100 micrometers. In other words, in the manufacturing process, the substrate 50A shown in FIG. 6 has a thickness (equal to the width W2) ranging between 30 and 100 micrometers. In Y-axis, the two cutting paths 54 and 55 shown in FIG. 8 have a maximum distance (equal to the width W1) also ranging between 30 and 100 micrometers. This size range is suitable for processing the first and second transition segments 442 and 452 and the first and second lower plane segments 443 and 453 to reduce the thickness and width of the tip portion.

Figure 9:
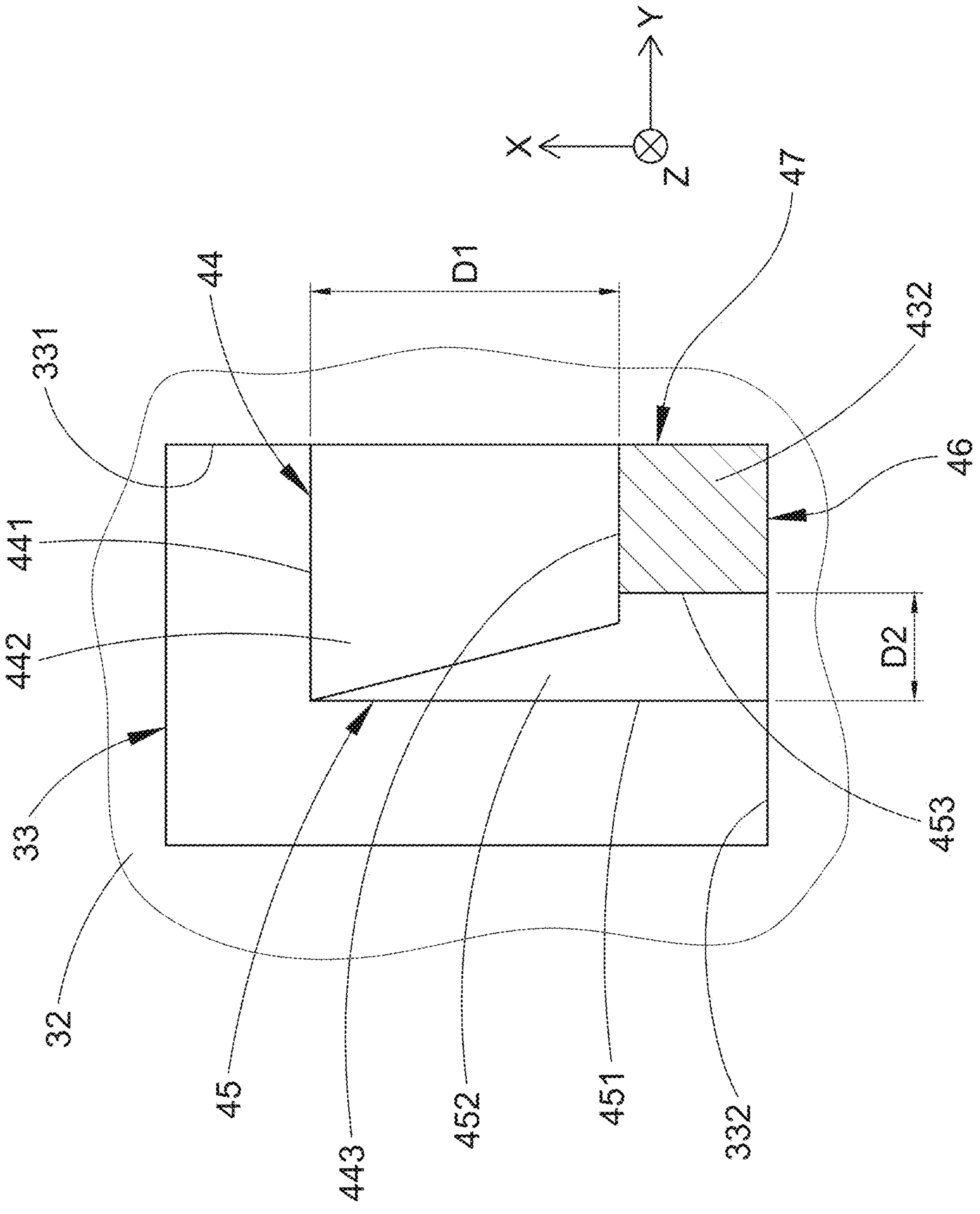
FIG. 9 is similar to FIG. 3, but showing a variant in which the body of the vertical probe has a rectangular cross-section.

In this embodiment, the cross-section of the body 41 is square, meaning that the widths W1 and W2 shown in FIG. 3 are equal, and the cross-section of the tip contact section 432 is also square, meaning that widths W3 and W4 are equal. In this way, the vertical probe 40 has a reduction in width of the tip portion (i.e., the difference between W1 and W3) equal to a reduction in thickness of the tip portion (i.e., the difference between W2 and W4), thereby avoiding a relatively greater stress concentration in one of the horizontal axes. However, as shown in FIG. 9, the cross-section of the body 41 may be rectangular, while the cross-section of the tip contact section 432 remains square. In this case, the shorter sides of the cross-section of the body 41 are at the first and third sides 44, 46, and the longer sides are at the second and fourth sides 45, 47. Consequently, the tip portion 43 will have a reduction in thickness at the first side 44 of greater than that at the second side 45. Specifically, the distance D1 along the X-axis between the first upper plane segment 441 and the first lower plane segment 443 on the first side 44 is greater than the distance D2 along the Y-axis between the second upper plane segment 451 and the second lower plane segment 453 on the second side 45. In other words, the cross-sectional area of the tip portion 43 will have a relatively greater reduction on the first side 44 and a relatively smaller reduction on the second side 45, such that the tip portion 43 has a relatively smaller stress concentration on the second side 45. Therefore, orienting the second side 45 toward the horizontal axis (i.e., the Y-axis) along which the upper and lower die units 20 and 30 have a relatively greater offset relative to each other may make the vertical probe 40 not to break easily. Additionally, the short sides of the cross-section of the body 41 are parallel to the horizontal axis (i.e., the Y-axis) along which a relatively greater offset occurs, resulting in good effect of elastic deformation. Furthermore, the body 41 may be configured having one or more slits (not shown) penetrating through the first side 44 and the third side 46, which could further enhance the effect of elastic deformation. In the present invention, it is described that the cross-section of the tip contact section 432 is square and the cross-sections of the body 41 is square or rectangular, wherein the so-called square or rectangular cross-section is not limited to be a perfect square or rectangular shape but also includes a square or rectangular shape having four corners which are not perfect right angled due to processing errors or chamfers.

Referring to FIGS. 2 and 4, in this invention, the distance along the Z-axis between the first lower boundary line 445 and the contact end 433 is defined as the first height H1, and the distance along the Z-axis between the second lower boundary line 455 and the contact end 433 is defined as the second height H2. In the first preferred embodiment, the first height H1 is greater than the second height H2. When the tip portion 43 probes the device under test, stress tends to concentrate in the first and second transition segments 442, 452 and the first and second lower plane segments 443, 453, which makes these segments more susceptible to fracture. By designing the first and second lower boundary lines 445, 455 at different heights, i.e., making the heights of the first and second lower plane segments 443, 453 unequal, the stress concentration issue is mitigated, making the vertical probe 40 less prone to fracture. Alternatively, the second height H2 could be designed to be greater than the first height H1; the aforesaid effect can be achieved as long as the first height H1 and the second height H2 are not equal. To achieve this structural feature, in the method of making the vertical probe 40, the cutting processing as shown in FIG. 8 produces a position of the second lower boundary line 455 (i.e., the turning point 552 on cutting path 55), which is defined with the third position P3 along the Z-axis at a distance D3 that differs from the distance D4 along the Z-axis between the second position P2 and the third position P3.

Figure 10:
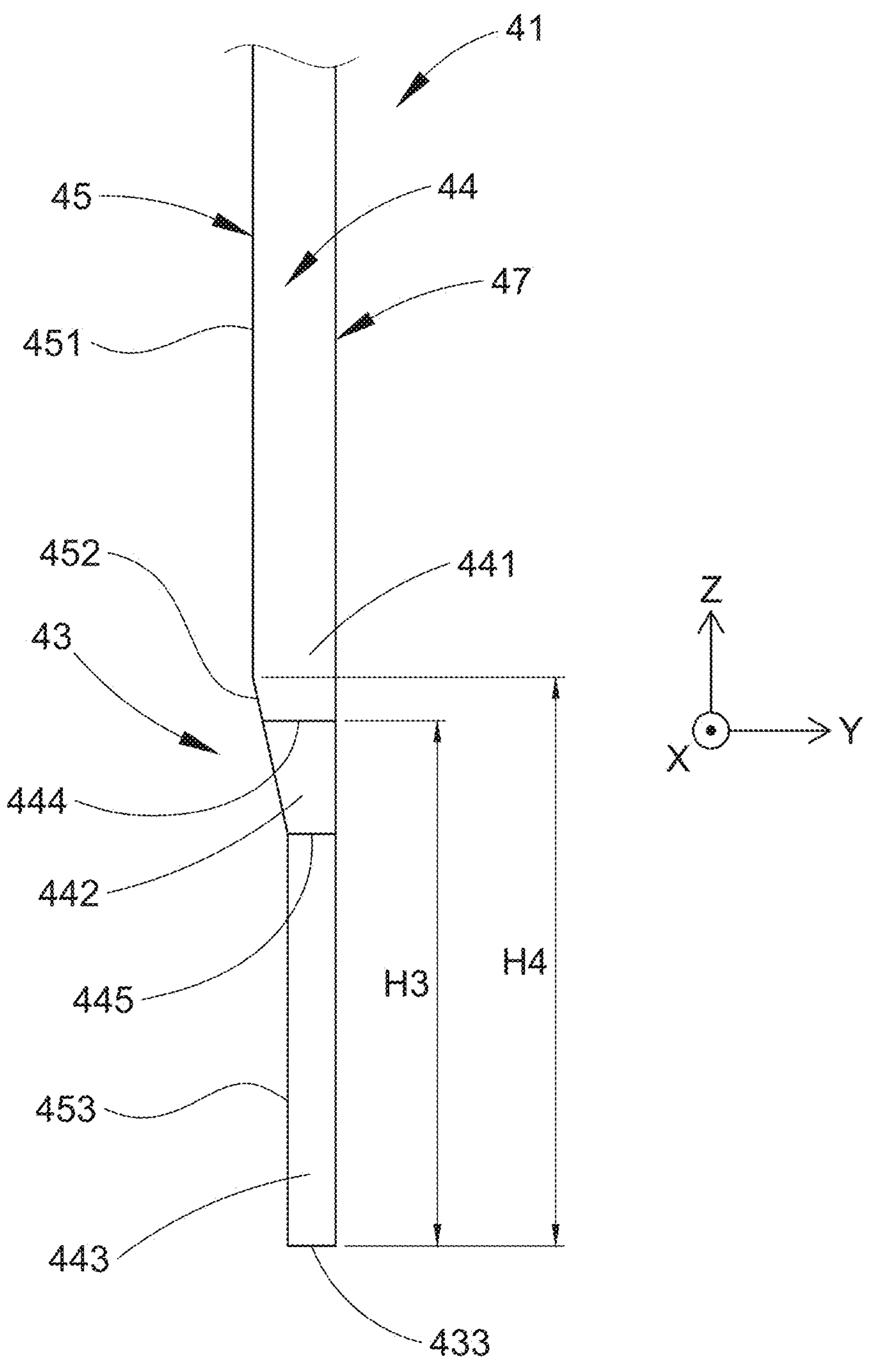
FIG. 10 is a schematic plan view of a vertical probe provided in accordance with a second preferred embodiment of the present invention.
Figure 11:
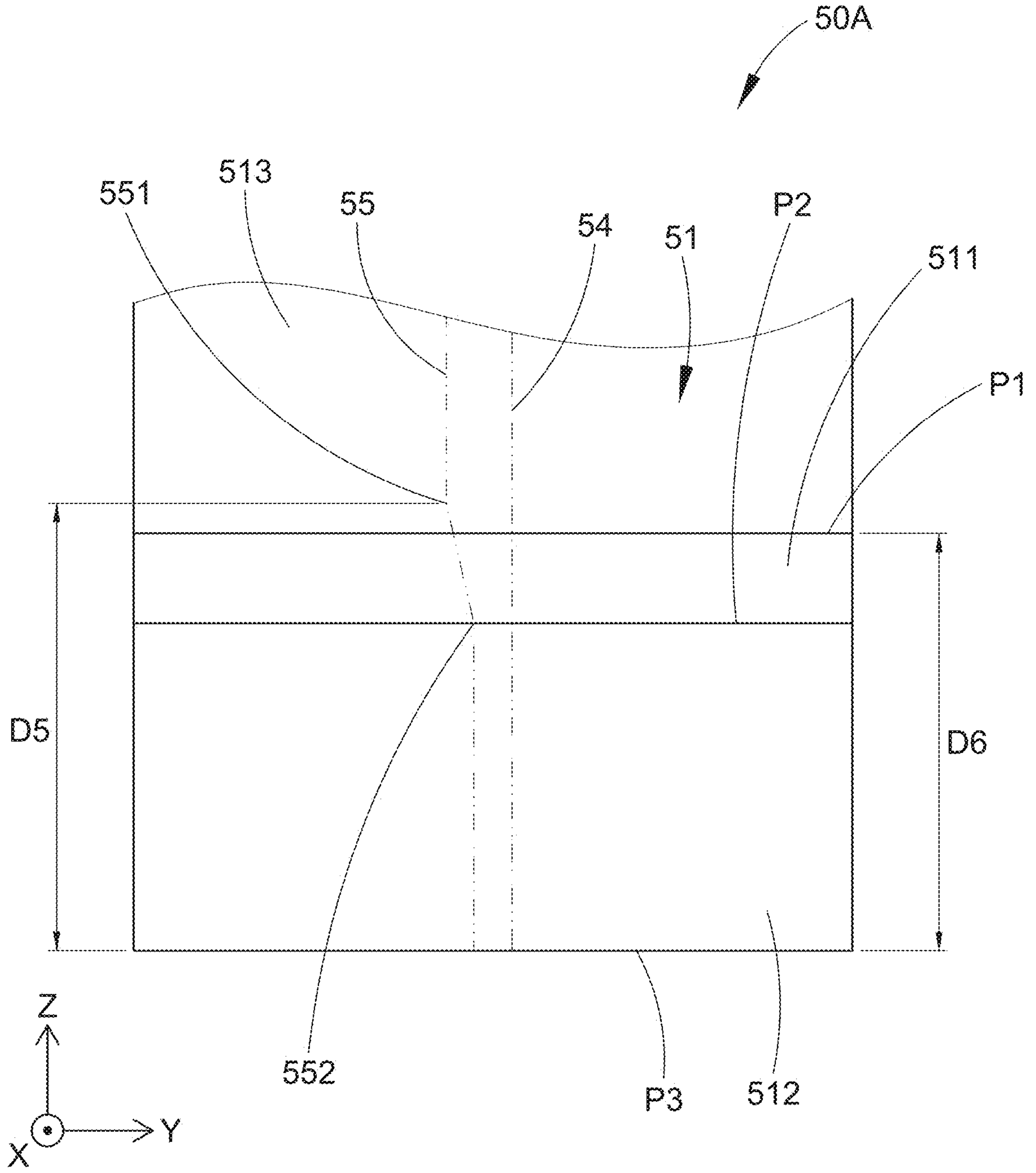
FIG. 11 is similar to FIG. 8, but showing a cutting processing for the vertical probe provided by the second preferred embodiment of the present invention.

The aforementioned effect may also be achieved by designing the first and second upper boundary lines 444 and 454 at different heights. For example, in the vertical probe provided by a second preferred embodiment of the present invention shown in FIG. 10, the distance along the Z-axis between the first upper boundary line 444 and the contact end 433 is defined as a third height H3, while the distance along the Z-axis between the second upper boundary line 454 (i.e., the junction between the second upper plane segment 451 and the second transition segment 452 on the second side 45) and the contact end 433 is defined as a fourth height H4. By making the fourth height H4 greater than the third height H3, or vice versa, i.e., making the total heights of the first lower plane segment 443 and the first transition segment 442 different from the total heights of the second lower plane segment 453 and the second transition segment 452, the stress concentration issue may also be mitigated, making the vertical probe 40 less prone to fracture. To achieve this structural feature, the cutting processing in the method of making the vertical probe is shown in FIG. 11. This cutting processing produces a position of the second upper boundary line 454 (i.e., turning point 551 on cutting path 55), which is defined with the third position P3 along the Z-axis at a distance D5 that differs from the distance D6 along the Z-axis between the first position P1 and the third position P3. In the present invention, the first and second lower boundary lines 445, 455 may be positioned at different heights, and the first and second upper boundary lines 444, 454 may also be positioned at different heights, further mitigating the stress concentration issue and making the vertical probe less prone to fracture.

In the first and second preferred embodiments, the distance D7 between the second upper boundary line 454 and the second lower boundary line 455 is greater than the distance D8 between the first upper boundary line 444 and the first lower boundary line 445, as shown in FIG. 4. This means that the second transition segment 452 has a length longer than that of the first transition segment 442, causing that the second transition segment 452 may have a better stress distribution effect compared to the first transition segment 442. Under the condition that the upper and lower die units 20, 30 are displaced relative to each other only along the Y-axis, or the upper and lower die units 20, 30 are displaced relative to each other along the Y-axis at a displacement greater than a displacement along the X-axis, the vertical probe 40 will experience a relatively greater stress along the Y-axis. Since the second transition segment 452 faces toward the Y-axis and has a relatively greater length, it can effectively disperse the relatively greater stress experienced on the vertical probe 40 along the Y-axis. The lengths of distances D7 and D8 may also be designed according to the relative displacements of the upper and lower die units 20, 30 along the X and Y axes to further improve the stress concentration issue, making the vertical probe less prone to fracture.

Figure 12:
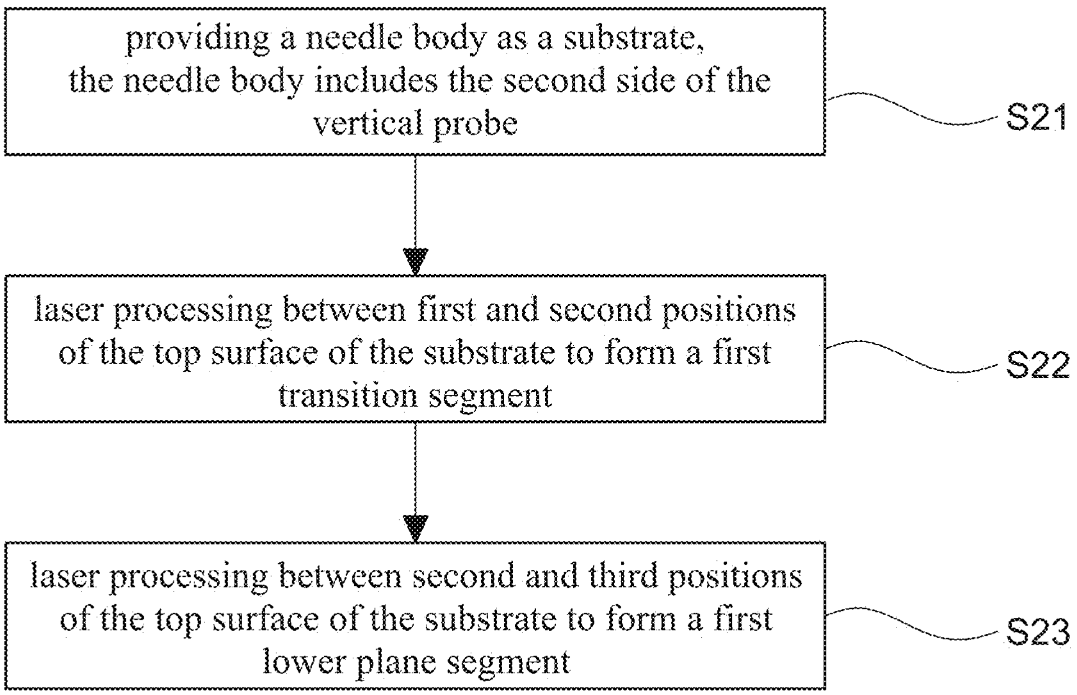
FIG. 12 is a flowchart of an alternative method of making the vertical probe provided by the present invention.
Figure 13:
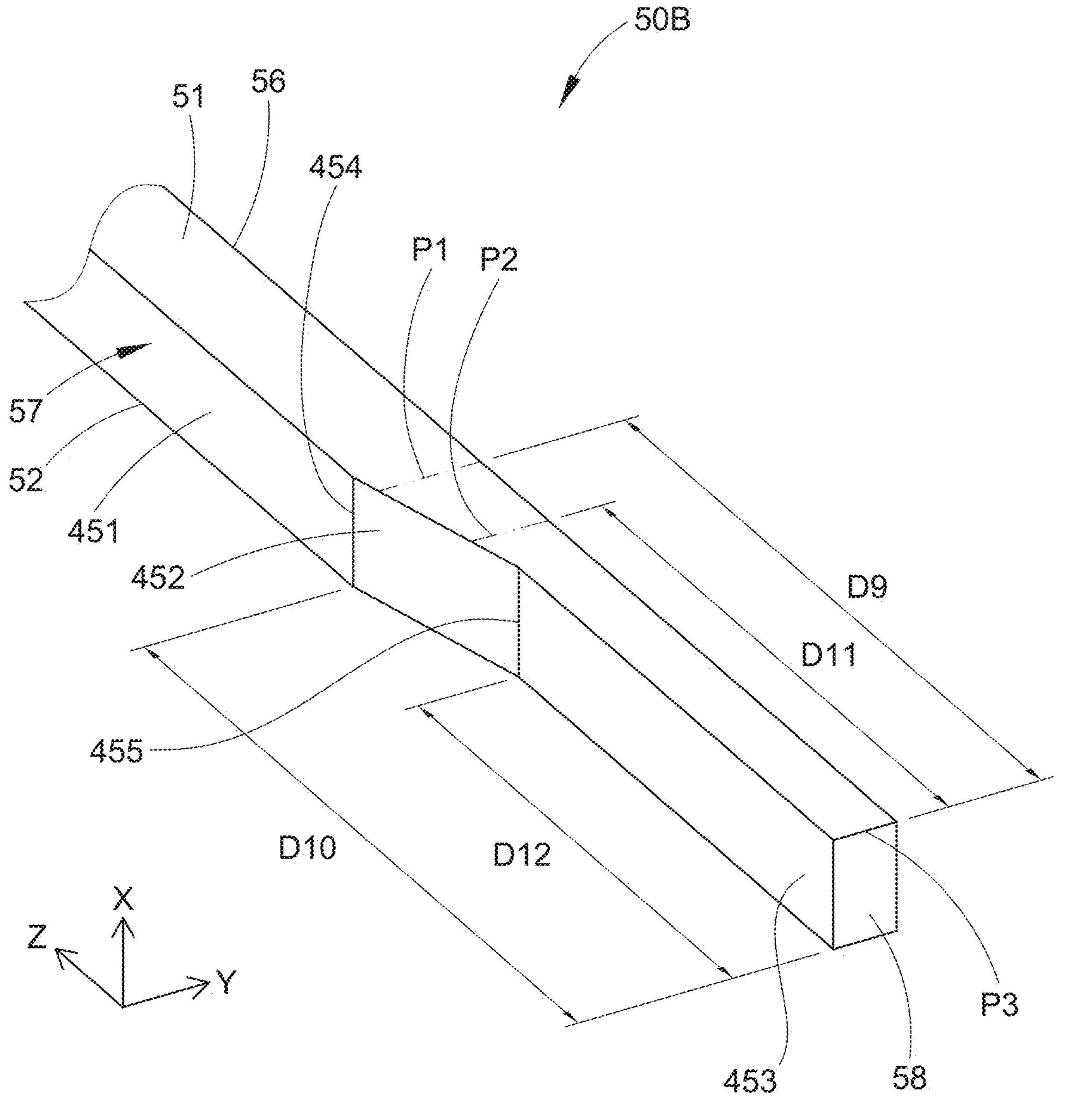
FIG. 13 is a schematic perspective view illustrating the method shown in FIG. 12.

Referring to FIGS. 12 and 13, the vertical probe 40 may also be manufactured by an alternative method that includes the following steps S21 to S23.

Step S21 involves providing a substrate 50B (as shown in FIG. 13), which is an elongated needle body made of conductive material. The substrate 50B has a top surface 51, a bottom surface 52 opposite to the top surface 51, and two opposing sides 56 and 57. For example, the needle body may be made by Micro-Electro-Mechanical Systems processing, typically by forming multiple needle bodies simultaneously on a substrate plate (not shown) and then performing the subsequent steps on all needle bodies, resulting in multiple vertical probes. FIG. 13 illustrates one needle body as an example. At this stage, the needle body already has the required side profile for the vertical probe 40, so the sides 56 and 57 of the needle body 50B become the fourth side 47 and the second side 45 of the vertical probe 40 (as shown in FIG. 4), respectively. In other words, the needle body 50B provided in step S21 already includes the second upper plane segment 451, second transition segment 452, second lower plane segment 453, second upper boundary line 454, and second lower boundary line 455 of the second side 45 of the vertical probe 40. The maximum width and thickness of the substrate 50B provided in step S21 will be equal to the width and thickness of the body 41 of the completed vertical probe 40, as shown by W1 and W2 in FIG. 3.

In another embodiment, the needle body may be formed by a laser processing (e.g., laser cutting). Multiple needle bodies are typically formed simultaneously on a substrate plate (not shown), creating the side profile needed for the vertical probe 40. Thus, the sides 56 and 57 of the needle body 50B become the fourth side 47 and second side 45 of the vertical probe 40 (as shown in FIG. 4), respectively.

Step S22 involves using a laser processing (e.g., laser ablation) on the top surface 51 of the substrate 50B between a first position P1 and a second position P2 to form the first transition segment 442 of the vertical probe 40 (as shown in FIG. 4).

Step S23 involves using the above-mentioned laser processing on the top surface 51 of the substrate 50B between the second position P2 and a third position P3 to form the first lower plane segment 443 of the vertical probe 40 (as shown in FIG. 4).

In other words, after step S22, step S23 is continuously performed with the same laser processing, making the top surface 51 of the substrate 50B the first side 44 of the vertical probe 40. The starting position for forming the first lower plane segment 443 is the end position of the first transition segment 442 (i.e., the second position P2), and the end position of the first lower plane segment 443 (i.e., the third position P3) is located at an end 58 of the substrate 50B.

In this manufacturing method, the distance D9 between the first and third positions P1 and P3 along the Z-axis can be made unequal to the distance D10 between the second upper boundary line 454 and the third position P3 along the Z-axis. This design makes the first and second upper boundary lines 444, 454 of the resulted vertical probe 40 misaligned. That is, the third height H3 and fourth height H4, as shown in FIG. 10, are unequal, thereby mitigating the stress concentration issue and making the vertical probe 40 less prone to fracture. Similarly, the distance D11 between the second and third positions P2 and P3 along the Z-axis may be made unequal to the distance D12 between the second lower boundary line 455 and the third position P3 along the Z-axis. This results in the first and second lower boundary lines 445, 455 of the vertical probe 40 being misaligned. That is, the first height H1 and the second height H2, as shown in FIG. 2, are unequal, thereby further mitigating the stress concentration issue and making the vertical probe 40 less prone to fracture.

Figure 14:
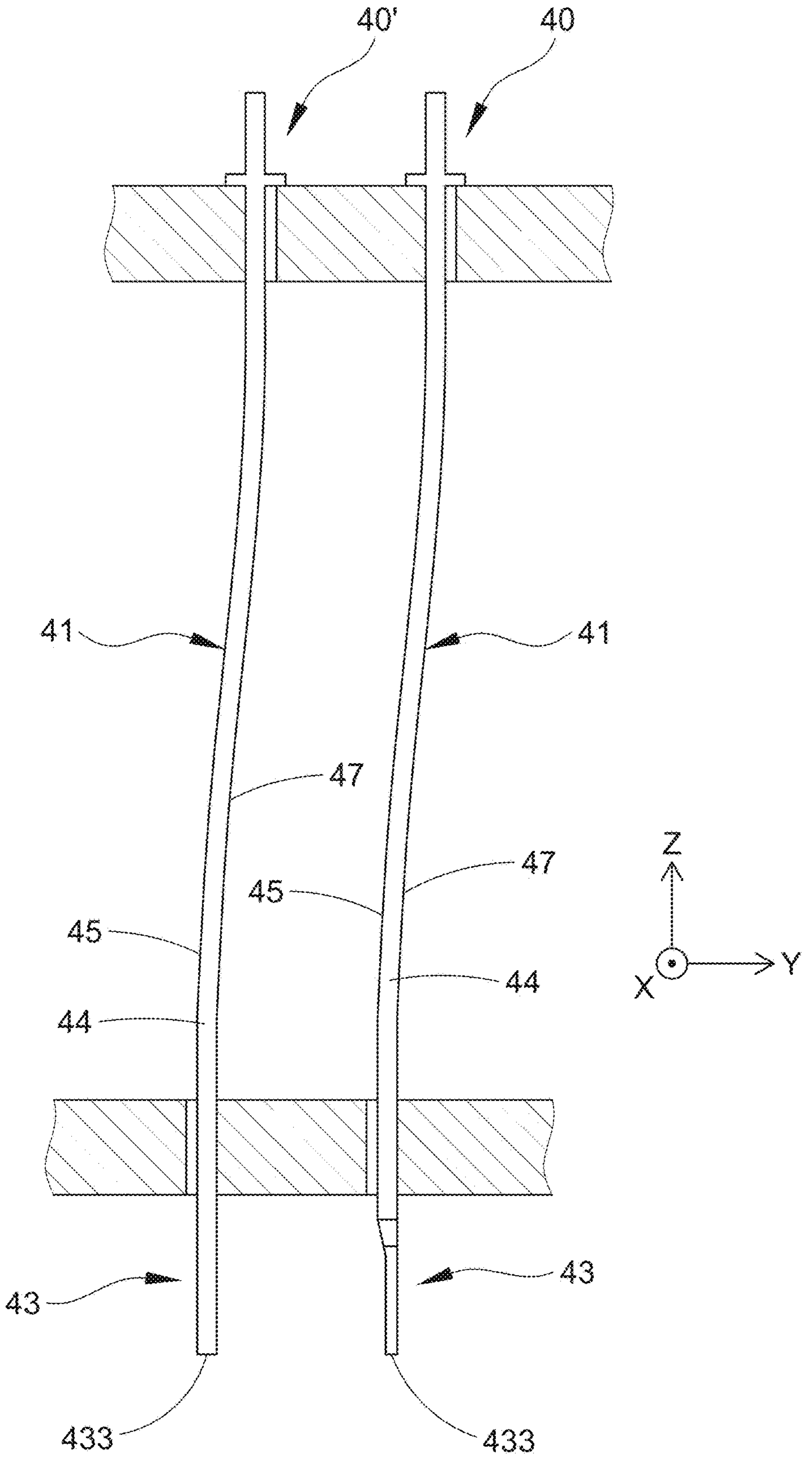
FIG. 14 is a schematic cross-sectional view of a probe head provided in accordance with a third preferred embodiment of the present invention.

Referring to FIG. 14, a probe head provided by a third preferred embodiment of the present invention is similar to that of the first preferred embodiment. However, in this embodiment, the probe head includes two types of vertical probes 40 and 40'. The vertical probe 40 may adopt any of the previously described configurations, with the tip portion 43 featuring reductions along the first side 44 and the second side 45. Compared to the vertical probe 40, the only difference in the vertical probe 40' is that its tip portion 43 does not have the first and second transition segments 442, 452 and the first and second lower plane segments 443, 453. That is, all four sides 44 to 47 of the vertical probe 40' extend in a planar manner from the body 41 to the tip portion 43. Thus, the thickness and width of the tip portion 43 of the vertical probe 40' have not reduction and remain the same as those of the body 41. As a result, a contact end 433 of the tip portion 43 of the vertical probe 40' has an area greater than that of the contact end 433 of the tip portion 43 of the vertical probe 40.

Figure 15:
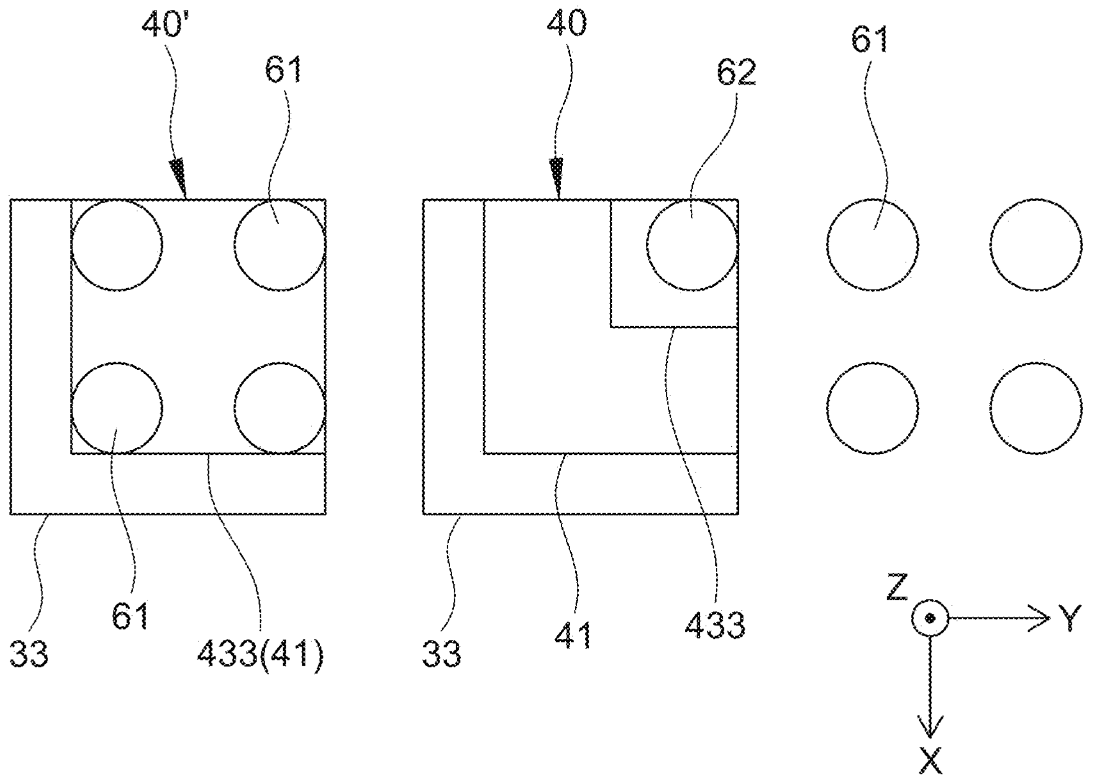
FIG. 15 is a schematic view showing that two vertical probes of the probe head provided by the third preferred embodiment of the present invention contact micro bumps.

Accordingly, the probe head in the embodiment shown in FIG. 14 is suitable for testing device under test with micro bumps. For example, FIG. 15 schematically shows nine micro bumps 61 and 62 arranged in a matrix. The micro bumps used to transmit power or ground signals may be clustered with three or four micro bumps thereof in groups. In the embodiment shown in FIG. 15, the micro bumps 61 are used for transmitting power or ground signals, while the micro bump 62, used for transmitting test signal, is arranged individually. FIG. 15 also schematically shows the contact ends 433 and bodies 41 of the two types of vertical probes 40 and 40', as well as the lower guide holes 33 through which the vertical probes 40 and 40' are inserted. The contact end 433 of the vertical probe 40' can be used to probe four micro bumps 61 simultaneously, whereas the contact end 433 of the vertical probe 40 is used to probe a single micro bump 62.

As a result, even though the tip portions 43 of the vertical probes 40 and 40' have different dimensions, the bodies 41 have substantially a same size. As such, the bodies 41 of the vertical probes 40 and 40' may be easily controlled to have a consistent deformation so as to achieve uniform probing performances and have substantially consistent wear rates of the vertical probes 40 and 40'.

It is noteworthy that, in the embodiment shown in FIG. 15, while the contact end 433 of the vertical probe 40' is configured to probe four micro bumps 61 simultaneously, the present invention is not limited thereto. The contact end 433 of the vertical probe 40' may be configured to probe multiple micro bumps 61, such as three micro bumps, nine micro bumps, or other quantities, simultaneously. However, the contact end 433 of the tip portion 43 of the vertical probe 40 will only correspond to a single micro bump.

A person having ordinary skill in the art will understand that the thickness and width of the tip portion 43 of the vertical probe 40 may be reduced by appropriate methods and ratios, so that the contact end 433 of the tip portion 43 of the vertical probe 40 may be configured corresponding to a single micro bump 62 exactly. After the thickness and width of the tip portion 43 of the vertical probe 40 are reduced, the bodies 41 of the vertical probes 40 and 40' may still be lined up relative to each other, such that the lower guide holes 33, through which the vertical probes 40 and 40' are inserted, may also be lined up relative to each other without the need of designing different arrangements of the lower guide hole 33 for the vertical probes 40 and 40'. This simplifies the design of the lower guide holes 33 and prevents damage to plate of the lower die unit 30 due to complex arrangements or inconsistent pitches of the lower guide holes 33.

The following is an example of how to install the vertical probes 40 and 40' into the upper guide holes 23 and the lower guide holes 33. Referring to FIGS. 14 and 15, along with FIGS. 1 and 4, the vertical probes 40 and 40' are installed in the lower die unit 30 in a way that the second sides 45 face toward the offset direction (i.e., the negative Y-axis direction) where the lower guide holes 33 are offset relative to the upper guide holes 23 along the first horizontal axis, causing that the fourth sides 47 are abutted against the inner surfaces 331 of the lower guide holes 33 facing the negative Y-axis. If there is also an offset between the upper and lower guide holes 23 and 33 along the second horizontal axis, the first sides 44 face toward the offset direction (i.e., positive X-axis) where the lower guide holes 33 are offset relative to the upper guide holes 23 along the second horizontal axis, causing that the third sides 46 are abutted against another inner surfaces 332 of the lower guide holes 33 facing the positive X-axis.

Finally, it should be noted that the components disclosed in the previous embodiments of the present invention are provided for illustrative purposes only and are not intended to limit the scope of the invention. Substitutions or modifications of other equivalent components should also be considered within the scope of the claims of the present invention.

What is claimed is:

1. A vertical probe, comprising:

a body extending along a longitudinal axis and having an elongated shape; and a tip portion connected with and extending from the body along the longitudinal axis;

wherein the vertical probe includes a first side, a second side, a third side opposite to the first side, and a fourth side opposite to the second side, and the third side and the fourth side extend in a planar manner from the body to the tip portion;

wherein the first side includes a first upper plane segment located at the body, and a first transition segment and a first lower plane segment both located at the tip portion in a way that the first transition segment is located between the first upper plane segment and the first lower plane segment, a first upper boundary line is formed between the first upper plane segment and the first transition segment, a first lower boundary line is formed between the first transition segment and the first lower plane segment, the first lower plane segment is closer to the third side than the first upper plane segment is, and the first transition segment extends from the first upper boundary line to the first lower boundary line in a way that the first transition segment gradually approaches the third side;

wherein the second side includes a second upper plane segment located at the body, and a second transition segment and a second lower plane segment both located at the tip portion in a way that the second transition segment is located between the second upper plane segment and the second lower plane segment, a second upper boundary line is formed between the second upper plane segment and the second transition segment, a second lower boundary line is formed between the second transition segment and the second lower plane segment, the second lower plane segment is closer to the fourth side than the second upper plane segment is, and the second transition segment extends from the second upper boundary line to the second lower boundary line in a way that the second transition segment gradually approaches the fourth side;

wherein the first transition segment and the first lower plane segment of the first side are formed by a laser processing.

2. The vertical probe as claimed in claim 1, wherein the tip portion has a contact end farthest from the body; a distance along the longitudinal axis between the first lower boundary line and the contact end is defined as a first height, a distance along the longitudinal axis between the second lower boundary line and the contact end is defined as a second height, and the first height and the second height are substantially unequal to each other.

3. The vertical probe as claimed in claim 1, wherein the tip portion has a contact end farthest from the body; a distance along the longitudinal axis between the first upper boundary line and the contact end is defined as a third height, a distance along the longitudinal axis between the second upper boundary line and the contact end is defined as a fourth height, and the third height and the fourth height are substantially unequal to each other.

4. The vertical probe as claimed in claim 1, wherein a distance between the second upper boundary line and the second lower boundary line is greater than a distance between the first upper boundary line and the first lower boundary line.

5. The vertical probe as claimed in claim 1, wherein each of the first side, the second side, the third side, and the fourth side at the body has a width ranging from 30 micrometers to 100 micrometers.

6. The vertical probe as claimed in claim 1, wherein the tip portion comprises a tip tapering section and a tip contact section; the tip tapering section comprises the first transition segment and the second transition segment; the tip contact section comprises the first lower plane segment and the second lower plane segment; the tip contact section has a square cross-section and the body has a square cross-section.

7. The vertical probe as claimed in claim 1, wherein the tip portion comprises a tip tapering section and a tip contact section; the tip tapering section comprises the first transition segment and the second transition segment, and the tip contact section comprises the first lower plane segment and the second lower plane segment; the second upper plane segment and the second lower plane segment of the second side are perpendicular to a first horizontal axis, while the first upper plane segment and the first lower plane segment of the first side are perpendicular to a second horizontal axis; a distance along the second horizontal axis between the first upper plane segment and the first lower plane segment of the first side is greater than a distance along the first horizontal axis between the second upper plane segment and the second lower plane segment of the second side.

8. A probe head, comprising:

an upper die unit, which includes an upper guide hole;

a lower die unit, which includes an upper surface facing the upper die unit, a lower surface, and a lower guide hole penetrating through the upper surface and the lower surface; and the vertical probe as claimed in claim 1, wherein the body of the vertical probe comprises an upper mounting part and a lower mounting part, and the upper mounting part and the lower mounting part are inserted into the upper guide hole and the lower guide hole, respectively, such that the tip portion of the vertical probe is located below the lower surface of the lower die unit.

9. The probe head as claimed in claim 8, wherein the probe head defines a first horizontal axis and a second horizontal axis, which are perpendicular to each other; the upper guide hole and the lower guide hole are displaced relative to each other along the first horizontal axis to result in that the fourth side of the vertical probe is abutted against an inner surface of the lower guide hole.

10. The probe head as claimed in claim 9, wherein the upper guide hole and the lower guide hole are also displaced relative to each other along the second horizontal axis to result in that the third side of the vertical probe is abutted against another inner surface of the lower guide hole.

11. The probe head as claimed in claim 10, wherein the upper guide hole and the lower guide hole are displaced relative to each other along the first horizontal axis at a distance greater than a distance at which the upper guide hole and the lower guide hole are displaced relative to each other along the second horizontal axis.

12. The probe head as claimed in claim 8, further comprising an another vertical probe, the another vertical probe comprising:

a body extending along another longitudinal axis and having an elongated shape; and a tip portion connected with and extending from the body of the another vertical probe along the another longitudinal axis;

wherein the another vertical probe includes a first side, a second side, a third side opposite to the first side, and a fourth side opposite to the second side, and each of the first side, the second side, the third side, and the fourth side of the another vertical probe extends in a planar manner from the body of the another vertical probe to the tip portion of the another vertical probe; the body of the another vertical probe includes an upper mounting part inserted into an another upper guide hole of the upper die unit, and a lower mounting part inserted into an another lower guide hole of the lower die unit, such that the tip portion of the another vertical probe is located below the lower surface of the lower die unit.

13. The probe head as claimed in claim 12, wherein the probe head defines a first horizontal axis and a second horizontal axis, which are perpendicular to each other; the upper guide hole and the lower guide hole are displaced relative to each other along the first horizontal axis to result in that the fourth sides of the vertical probe and the another vertical probe are abutted against inner surfaces of the lower guide hole and the another lower guide hole, respectively; the upper guide hole and the lower guide hole are also displaced relative to each other along the second horizontal axis to result in that the third sides of the vertical probe and the another vertical probe are abutted against another inner surfaces of the lower guide hole and the another lower guide hole, respectively; the upper guide hole and the lower guide hole are displaced relative to each other along the first horizontal axis at a distance greater than a distance at which the upper guide hole and the lower guide hole are displaced relative to each other along the second horizontal axis.

14. A method of making a vertical probe, which is used to make the vertical probe as claimed in claim 1, the method being characterized in that:

the first transition segment is formed by the laser processing between a first position and a second position on a top surface of a substrate, the substrate is made of a conductive material, and the first lower plane segment is formed by the laser processing between the second position and a third position on the top surface of the substrate.

15. The method of making the vertical probe as claimed in claim 14, characterized in that:

the second transition segment and the second lower plane segment of the second side are formed by a laser processing on the substrate.

16. The method of making the vertical probe as claimed in claim 14, comprising the steps of:

providing the substrate, which is a plate having the top surface and a bottom surface opposite to the top surface;

processing the top surface of the substrate between the first position and the second position by the laser processing to form a transition surface that gradually approaches the bottom surface from the first position to the second position;

processing the top surface of the substrate between the second position and the third position by the laser processing to form a process plane; and cutting the substrate into at least one said vertical probe by a cutting processing in a way that the first upper plane segment of the first side of said vertical probe is formed by an unprocessed portion of the top surface of the substrate, the first transition segment is formed by transition surface of the substrate, the first lower plane segment is formed by the process plane of the substrate, and the second side and the fourth side are formed by the cutting processing.

17. The method of making the vertical probe as claimed in claim 16, wherein the cutting processing is performed by using a laser processing.

18. The method of making the vertical probe as claimed in claim 16, wherein a distance along the longitudinal axis between the second upper boundary line of the second side formed by the cutting processing and the third position is substantially different from a distance along the longitudinal axis between the first position and the third position, or a distance along the longitudinal axis between the second lower boundary line of the second side formed by the cutting processing and the third position is substantially different from a distance along the longitudinal axis between the second position and the third position.

19. The method of making the vertical probe as claimed in claim 14, comprising the steps of:

providing the substrate, which is an elongated needle body that includes the second side of the vertical probe; and processing the top surface of the substrate between the first position and the second position by the laser processing to form the first transition segment, and processing the top surface of the substrate between the second position and the third position by the laser processing to form the first lower plane segment in a way that the top surface of the substrate forms the first side of the vertical probe.

20. The method of making the vertical probe as claimed in claim 19, wherein a distance along the longitudinal axis between the first position and the third position is substantially different from a distance along the longitudinal axis between the second upper boundary line of the second side and the third position, or a distance along the longitudinal axis between the second position and the third position is substantially different from a distance along the longitudinal axis between the second lower boundary line of the second side and the third position.

* * * * *